United States Patent
Kato et al.

(10) Patent No.: US 7,719,594 B2
(45) Date of Patent: May 18, 2010

(54) SOLID-STATE IMAGING DEVICE WITH OB REGION AND CAMERA PROVIDED WITH THE SAME

(75) Inventors: Yoshiaki Kato, Shiga (JP); Kazuya Yonemoto, Osaka (JP); Tsuyoshi Hasuka, Osaka (JP)

(73) Assignee: Panasonic Corporation, Osaka (JP)

( * ) Notice: Subject to any disclaimer, the term of this patent is extended or adjusted under 35 U.S.C. 154(b) by 725 days.

(21) Appl. No.: 11/533,561

(22) Filed: Sep. 20, 2006

(65) Prior Publication Data

US 2007/0091189 A1    Apr. 26, 2007

(30) Foreign Application Priority Data

Oct. 25, 2005    (JP)    ............................. 2005-310348

(51) Int. Cl.
  *H04N 3/14*    (2006.01)
  *H04N 5/335*    (2006.01)
(52) U.S. Cl. .................. 348/319; 348/282; 348/312; 348/317; 348/320
(58) Field of Classification Search .................. None
  See application file for complete search history.

(56) References Cited

U.S. PATENT DOCUMENTS

| | | | | |
|---|---|---|---|---|
| 7,277,128 B2* | 10/2007 | Miyahara | .................. | 348/249 |
| 7,515,184 B2* | 4/2009 | Fujii et al. | .................. | 348/282 |
| 7,564,492 B2* | 7/2009 | Nagayoshi et al. | .......... | 348/273 |
| 7,564,493 B2* | 7/2009 | Kato | .......................... | 348/294 |
| 2004/0150733 A1 | 8/2004 | Nagayoshi et al. | | |
| 2005/0151169 A1* | 7/2005 | Miyaguchi | .................. | 257/215 |

FOREIGN PATENT DOCUMENTS

| | | | |
|---|---|---|---|
| JP | 2004-180284 | | 6/2004 |
| JP | 2005-166826 | * | 6/2005 |

* cited by examiner

*Primary Examiner*—Ngoc-Yen T Vu
(74) *Attorney, Agent, or Firm*—Hamre, Schumann, Mueller & Larson, P.C.

(57) ABSTRACT

A solid-state imaging device, and a camera provided with this device, that can output high quality images at high speed are realized by preventing improper OB clamping in a solid-state imaging device that performs pixel mixing in the horizontal direction. Vertical final stages, which are the transfer stages closest to a horizontal transfer component 4, are provided with provided with independent transfer electrodes V3-1, V3-2, V3-3, V6-1, V5-2, and V5-3 that are independent of other columns in a region between the horizontal transfer component and an effective pixel region, and a common transfer electrode that is common to all of the columns in the region between the horizontal transfer component 4 and the OB region. Further, in the vertical final stages, the entire region between the OB region and the horizontal transfer component, or the region minus openings formed for the wiring of V3-1 and V5-1 in the columns closest to the effective pixel region, is covered with a light blocking film.

7 Claims, 20 Drawing Sheets

SOLID-STATE IMAGING DEVICE WITH OB REGION AND CAMERA PROVIDED WITH THE SAME

BACKGROUND OF THE INVENTION

1. Field of the Invention

The present invention relates to a solid-state imaging device that converts received light into electrical signals and outputs them as video signals.

2. Description of Related Art

Solid-state imaging devices that convert received light into electric signals and output them as video signals have been known before now. Digital cameras that display images on the basis of video signals obtained from these solid-state imaging devices also have been known. Recent years have seen the need for better image quality and functionality in cameras featuring such solid-state imaging devices, and there has been growing demand for higher pixel density.

In an effort to raise the speed at which video signals are outputted in such solid-state imaging devices in order to achieve a moving picture display, for example, a drive method has been proposed in the past in which the number of pixels included in an output video signal is reduced by thinning out the pixels from which signal charges are read.

For example, JP 2004-180284A and 2005-166826A disclose a construction in which last transfer stages (split transfer components), which are the transfer stages of vertical transfer components that are closest to a horizontal transfer component, have identical transfer electrode configurations repeated every m (m is an integer of 2 or greater) columns, and vertical final stages of columns other than one of the m columns, or the vertical final stages of all the columns, are each provided with an independent transfer electrode that is independent of other columns so that an operation of transferring from the vertical final stages to the horizontal transfer component is controlled independently of the other columns. With this construction, the transfer from the vertical transfer components to the horizontal transfer component is combined with the transfer in the horizontal direction by the horizontal transfer component, which allows the pixel output to be rearranged or mixed as desired, and affords faster output of video signals.

FIG. 33 is a cross-sectional view of the structure of the split transfer component disclosed in the above-mentioned JP 2005-166826A. This split transfer component has a drive electrode with a two-layer structure comprising a first layer of polysilicon (not shown) laminated with a second layer of polysilicon 260, a first wiring 270, which is an aluminum layer that also serves to block light from the vertical transfer components (not shown), a second wiring 280 that is formed from tungsten and also serves as a light blocking film, and a contact plug 290 that electrically connects the first wiring 270 and the second polysilicon layer 260.

However, with the construction shown in FIG. 33, in the region directly under the OB region (the region between the horizontal transfer component and the OB region provided to the left and right of the effective pixel region), light leaks in from the gaps between the plug 290 and the second wiring 280, which is a problem in that it causes improper OB clamping.

SUMMARY OF THE INVENTION

To solve these problems, it is an object of the present invention to provide a solid-state imaging device that can output high quality images at high speed by preventing improper OB clamping in the solid-state imaging device that performs pixel mixing in the horizontal direction, and a camera provided with this device.

In order to achieve the stated object, the first solid-state imaging device according to the present invention comprises vertical transfer components provided corresponding to respective columns of two-dimensionally arranged pixels to vertically transfer signal charges read out from the pixels, and a horizontal transfer component for horizontally transferring the signal charges received from the vertical transfer components. Vertical final stages, which are the transfer stages closest to the horizontal transfer component in the vertical transfer components, have identical transfer electrode configurations repeated every m (m is an integer of 2 or greater) columns in a region between the horizontal transfer component and an effective pixel region. Vertical final stages of columns other than one of the m columns, or the vertical final stages of all the columns, are each provided with an independent transfer electrode that is independent of other columns so that an operation of transferring from the vertical final stages to the horizontal transfer component is controlled independently of the other columns. The vertical final stages have a common transfer electrode that is common to all of the columns in the region between the horizontal transfer component and a region including an OB region provided on one or both sides in the horizontal direction of the effective pixel region, and in the vertical final stages, all of the region between the OB region and the horizontal transfer component is covered with a light blocking film.

The second solid-state imaging device according to the present invention comprises vertical transfer components provided corresponding to respective columns of two-dimensionally arranged pixels to vertically transfer signal charges read out from the pixels, and a horizontal transfer component for horizontally transferring the signal charges received from the vertical transfer components. Vertical final stages, which are the transfer stages closest to the horizontal transfer component in the vertical transfer components, have identical transfer electrode configurations repeated every m (m is an integer of 2 or greater) columns in a region between the horizontal transfer component and an effective pixel region. Vertical final stages of columns other than one of the m columns, or the vertical final stages of all the columns, are each provided with an independent transfer electrode that is independent of other columns so that an operation of transferring from the vertical final stages to the horizontal transfer component is controlled independently of the others of the m columns. The vertical final stages have a common transfer electrode that is common to all of the columns in the region between the horizontal transfer component and a region including an OB region provided on one or both sides in the horizontal direction of the effective pixel region. Wiring for applying drive signals is connected to both ends of the common transfer electrode. In the vertical final stages, the region between the OB region and the horizontal transfer component is covered with a light blocking film, except for openings formed in the columns closest to the effective pixel region. The wiring is connected to one of the ends of the common transfer electrode via these openings.

The camera according to the present invention is provided with the above-mentioned first or second solid-state imaging device.

With the present invention, it is possible to provide a solid-state imaging device that can output high quality images at high speed by preventing improper OB clamping in the solid-state imaging device that performs pixel mixing in the horizontal direction, and a camera provided with this device.

DETAILED DESCRIPTION OF THE INVENTION

Figure 1:
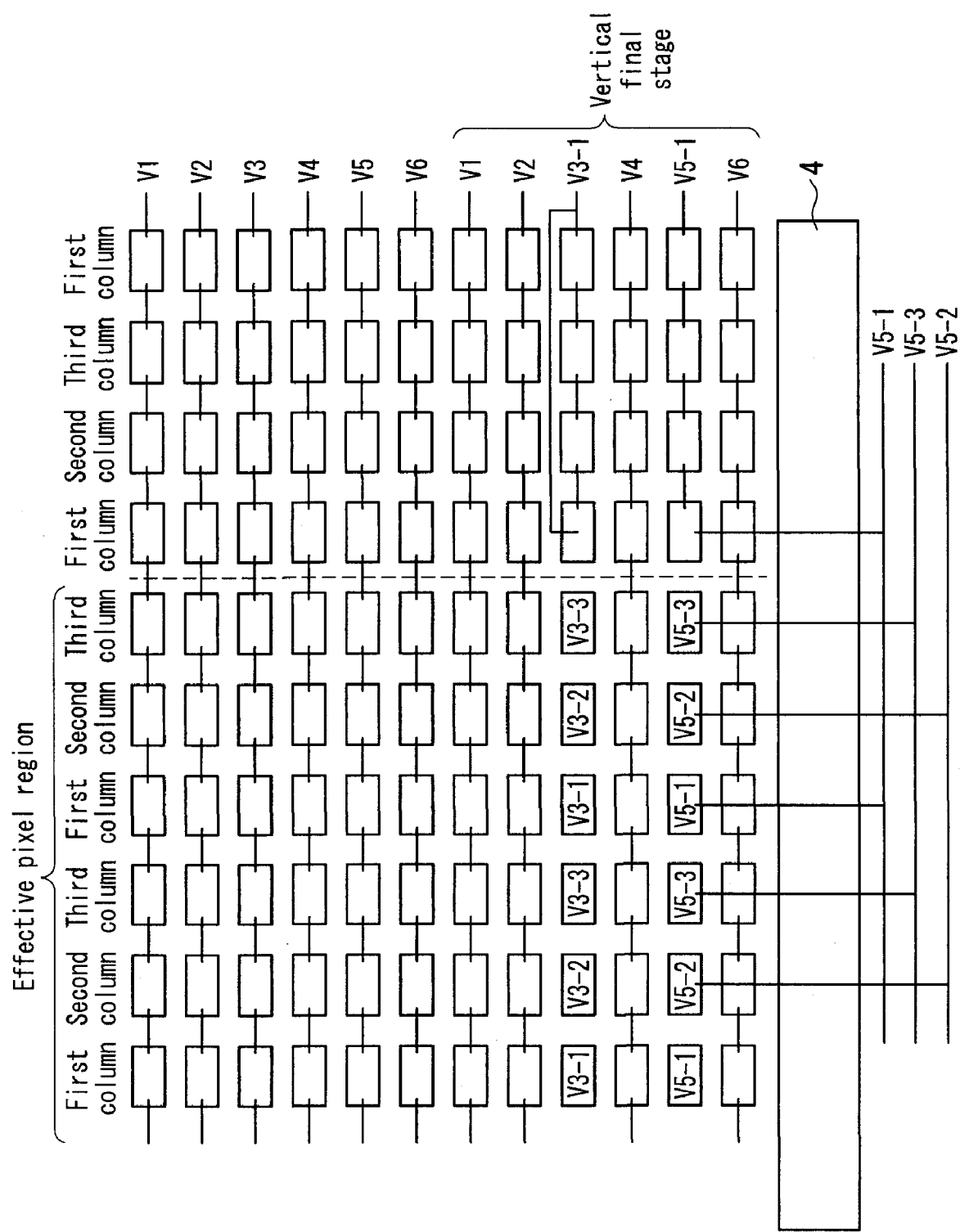
FIG. 1 is a schematic diagram illustrating the simplified structure of a solid-state imaging device according to an embodiment of the present invention.

The first solid-state imaging device according to the present invention comprises vertical transfer components provided corresponding to respective columns of two-dimensionally arranged pixels to vertically transfer signal charges read out from the pixels, and a horizontal transfer component for horizontally transferring the signal charges received from the vertical transfer components. Vertical final stages, which are the transfer stages closest to the horizontal transfer component in the vertical transfer components, have identical transfer electrode configurations repeated every m (m is an integer of 2 or greater) columns in a region between the horizontal transfer component and an effective pixel region. Vertical final stages of columns other than one of the m columns, or the vertical final stages of all the columns, are each provided with an independent transfer electrode that is independent of other columns so that an operation of transferring from the vertical final stages to the horizontal transfer component is controlled independently of the other columns. The vertical final stages have a common transfer electrode that is common to all of the columns in the region between the horizontal transfer component and a region including an OB region provided on one or both sides in the horizontal direction of the effective pixel region. The vertical final stages, all of the region between the OB region and the horizontal transfer component is covered with a light blocking film.

In the above construction, the phrase "region including an OB region" means that at least an OB region is included, and that the OB region as well as its nearby effective pixel region may be included. With this construction, the vertical final stages have a common transfer electrode that is common to all of the columns in the region between the horizontal transfer component and a region including an OB region provided on one or both sides in the horizontal direction of the effective pixel region, and in the vertical final stages, all of the region between the OB region and the horizontal transfer component is completely covered with a light blocking film, thereby preventing improper OB clamping. This provides a solid-state imaging device with which high quality images can be outputted at high speed.

The second solid-state imaging device according to the present invention comprises vertical transfer components provided corresponding to respective columns of two-dimensionally arranged pixels to vertically transfer signal charges read out from the pixels, and a horizontal transfer component for horizontally transferring the signal charges received from the vertical transfer components. Vertical final stages, which are the transfer stages closest to the horizontal transfer component in the vertical transfer components, have identical transfer electrode configurations repeated every m (m is an integer of 2 or greater) columns in a region between the horizontal transfer component and an effective pixel region. Vertical final stages of columns other than one of the m columns, or the vertical final stages of all the columns, are each provided with an independent transfer electrode that is independent of other columns so that an operation of transferring from the vertical final stages to the horizontal transfer component is controlled independently of the others of the m columns. The vertical final stages have a common transfer electrode that is common to all of the columns in the region between the horizontal transfer component and a region including an OB region provided on one or both sides in the horizontal direction of the effective pixel region. Wiring for applying drive signals is connected to both ends of the common transfer electrode. In the vertical final stages, the region between the OB region and the horizontal transfer component is covered with a light blocking film, except for openings formed in the columns closest to the effective pixel region. The wiring is connected to one of the ends of the common transfer electrode via these openings.

In the above construction, the phrase "region including an OB region" means that at least an OB region is included, and that the OB region as well as its nearby effective pixel region may be included. With this construction, improper OB clamping is prevented because the vertical final stages have a common transfer electrode that is common to all of the columns in the region between the horizontal transfer component and a region including an OB region provided on one or both sides in the horizontal direction of the effective pixel region, and the region between the OB region and the horizontal transfer component is covered substantially completely with a light blocking film, except for openings formed in the columns closest to the effective pixel region. This provides a solid-state imaging device with which high quality images can be outputted at high speed. Furthermore, waveform rounding of the drive signals is prevented by having the wiring for applying the drives signals be connected to both ends of the common transfer electrode.

With this second solid-state imaging device, it is preferable if the wiring connected to one of the ends of the common transfer electrode straddles the upper layer of the horizontal transfer component. Since the wiring of the independent transfer electrodes straddles the upper layer of the horizontal transfer component, wiring can be patterned in the same way, and this simplifies the manufacturing process.

With the first or second solid-state imaging device, it is preferable if the drive signals applied to the common transfer electrode are common to the drive signals applied to any of the transfer electrodes in the effective pixel region. Because the vertical final stages of the OB region serve as a common transfer electrode, this changes the pixels that are mixed at the boundary between the effective region and the OB region, and the number of mixed pixels is inconsistent, leading to the possibility of an increase in dark signals as well, but an advantage to such a construction is that the increase in dark signals can be kept to a minimum. Another reason that the above is preferable is that the number of terminals and types of drive pulses can be reduced.

Specific embodiments of the present invention now will be described through reference to the drawings.

Figure 2:
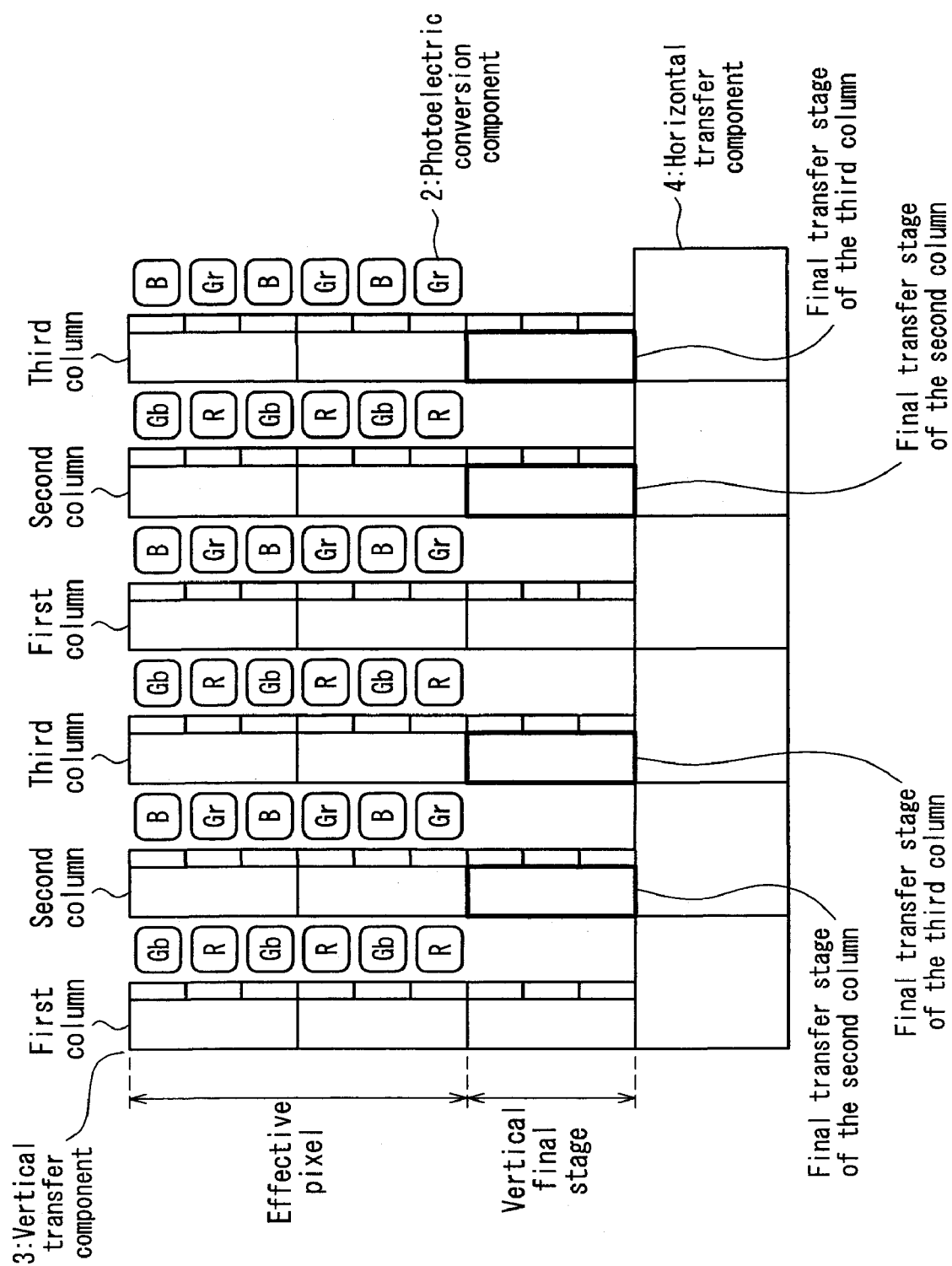
FIG. 2 is an explanatory diagram showing combinations of pixels that are mixed in a solid-state imaging device according to an embodiment of the present invention.

FIG. 1 is a schematic diagram illustrating the simplified structure of the solid-state imaging device according to this embodiment and in particular shows the configuration of a transfer electrode, and FIG. 2 is a schematic diagram illustrating the simplified structure of the solid-state imaging device according to this embodiment, and in particular shows the relationship between pixels and transfer stages.

As shown in FIG. 2, the solid-state imaging device 1 in this embodiment comprises photoelectric conversion components 2 disposed two-dimensionally corresponding to pixels, vertical transfer components 3, and a horizontal transfer component 4. The vertical transfer components 3 and horizontal transfer component 4 are each constituted by a CCD. Photodiodes may be used as the photoelectric conversion components 2. Each of the photoelectric conversion components 2 is provided with color filters selected from three colors, namely, red (R), green (G), and blue (B). In this embodiment, the R, G, and B filters are each disposed periodically, every two pixels, in both the vertical and horizontal directions. For instance, as shown in FIG. 2, if we let one unit be a total of four pixels comprising two vertical pixels×two horizontal pixels, the color filters are disposed so that the lower left pixel is R, the lower right and upper left pixels are G, and the upper right pixel is B. Control signals are transmitted from a control unit (not shown) to transfer electrodes of the vertical transfer components 3 and the horizontal transfer component 4, and this controls the operation of the solid-state imaging device 1. The above-mentioned control unit is provided outside the solid-state imaging device 1 and is connected to the solid-state imaging device 1 by signal lines. Alternatively, the control unit may be formed integrally with the solid-state imaging device 1.

With the solid-state imaging device 1 of this embodiment, one transfer stage of the vertical transfer components 3 (called a "vertical transfer stage") is made up of three rows of the photoelectric conversion components 2 arranged in the vertical direction (namely, for three pixels in the vertical direction). The solid-state imaging device 1 is configured such that the signal charges of three pixels are added together at every other pixel (row) in the vertical direction in the vertical transfer components 3. The method for mixing the signal charges of the three pixels at every other row in the vertical direction in the vertical transfer components 3 can involve the following steps (1) to (3), for example.

(1) First, the signal charge of ⅓ pixel at every two rows in the vertical direction is read out to the vertical transfer components 3, and two pixels' worth of charge is vertically transferred.

(2) Next, the signal charge of the second row of pixels in the forward direction from the previously read pixels (the vertical transfer direction) is read out to the vertical transfer components 3 and mixed with that of the previously read pixels, and two rows' worth of charge is vertically transferred.

(3) Then, the signal charge of the remaining pixels is read out to the vertical transfer components 3.

The signal charge of three pixels at every other row can be mixed by the above steps (1) to (3). As a result, the number of pixels in the vertical direction with the solid-state imaging device 1 is cut to ⅓.

Also, the vertical transfer components 3 located in the effective pixel region of the solid-state imaging device 1 are constituted such that the structure is the same in three-column units in the horizontal direction. In the drawings referred to in this embodiment, the signal charge of the horizontal transfer component 4 is shown as being outputted on the left side in the drawings, and the vertical transfer components 3 in each three-column unit are called the first column, second column, and third column (labeled column 1, column 2, and column 3 in the drawings), respectively starting from the one closest to the output side of the horizontal transfer component 4. The transfer stages of the vertical transfer components 3 closest to the horizontal transfer component 4 hereinafter will be referred to as the vertical final stages.

The electrode structure of the solid-state imaging device 1 now will be described through reference to FIG. 1. In FIG. 1, in the vertical final stages and the vertical transfer stages one stage directly above them, only the ends on the opposite side from the output side of the horizontal transfer component 4 are shown (the right side of the effective pixel region). Also, in FIG. 1, in the OB region on the opposite side from the output side of the horizontal transfer component 4, only four bits of electrode structure is shown for the sake of simplifying the drawings, but in an actual solid-state imaging device, from 40 to 50 bits of OB region generally is reserved on the opposite side from the output side of the horizontal transfer component 4.

As shown in FIG. 1, with the solid-state imaging device 1, each of the vertical transfer stages of the vertical transfer components 3 is made up of six phases (V1 to V6) of transfer electrodes (common electrodes). However, the vertical final stages alone have a different electrode structure from that of the other vertical transfer stages. Furthermore, the vertical final stages have a different electrode structure in the region directly under the effective pixel region (the region between the horizontal transfer component 4 and the effective pixel region) from that in the region directly under the OB region (the region between the horizontal transfer component 4 and the OB region).

As shown in FIG. 1, the first, second, fourth, and sixth phases of the vertical final stages are constituted by common electrodes with transfer electrodes V1, V2, V4, and V6 of the other vertical transfer stages. In the region directly under the effective pixel region in the vertical final stages, the third phase transfer electrode of the first column is constituted by an independent electrode V3-1 that is independent from the third phase transfer electrode (V3) of the other vertical transfer stages, and the fifth phase transfer electrode of the first column is constituted by an independent electrode V5-1 that is independent from the fifth phase transfer electrode (V5) of the other vertical transfer stages. Similarly, the third phase transfer electrode of the second column is constituted by an independent electrode V3-2, and the fifth phase transfer electrode of the second column is constituted by an independent electrode V5-2. Furthermore, the third phase transfer electrode of the third column is constituted by an independent electrode V3-3, and the fifth phase transfer electrode of the third column is constituted by an independent electrode V5-3.

Meanwhile, in the region directly under the OB region in the vertical final stages, the third phase and fifth phase transfer electrodes also are formed continuously and in common with the various columns, just as with the first phase, second phase, fourth phase, and sixth phase electrodes. In the example in FIG. 1, in the region directly under the OB region in the vertical final stages, the third phase and fifth phase transfer electrodes are formed as common electrodes with the above-mentioned independent electrodes V3-1 and V5-1.

Figure 3:
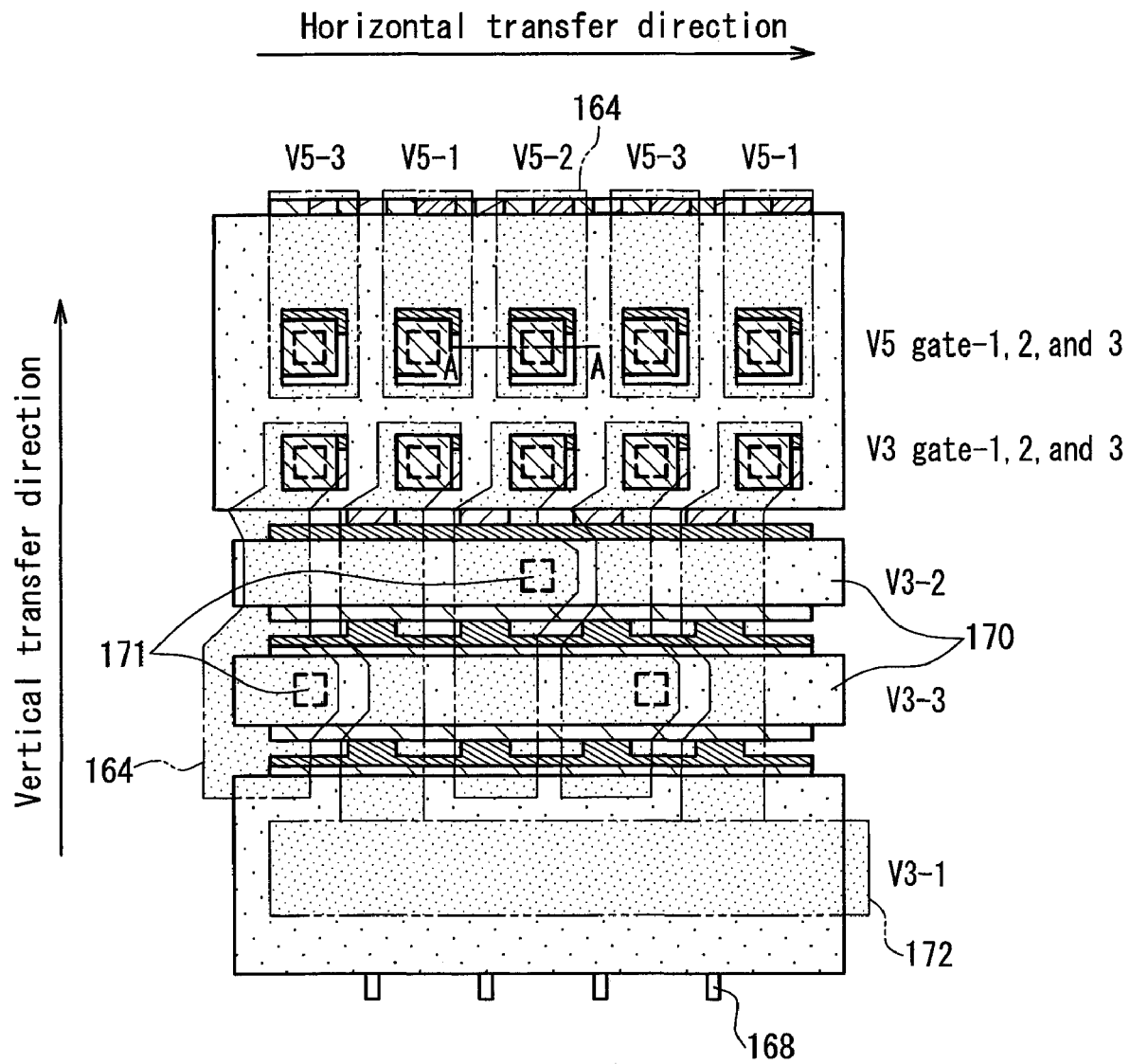
FIG. 3 is a diagram of the layout of the wiring and electrodes in the region directly under the effective pixel region in the vertical final stages.
Figure 4:
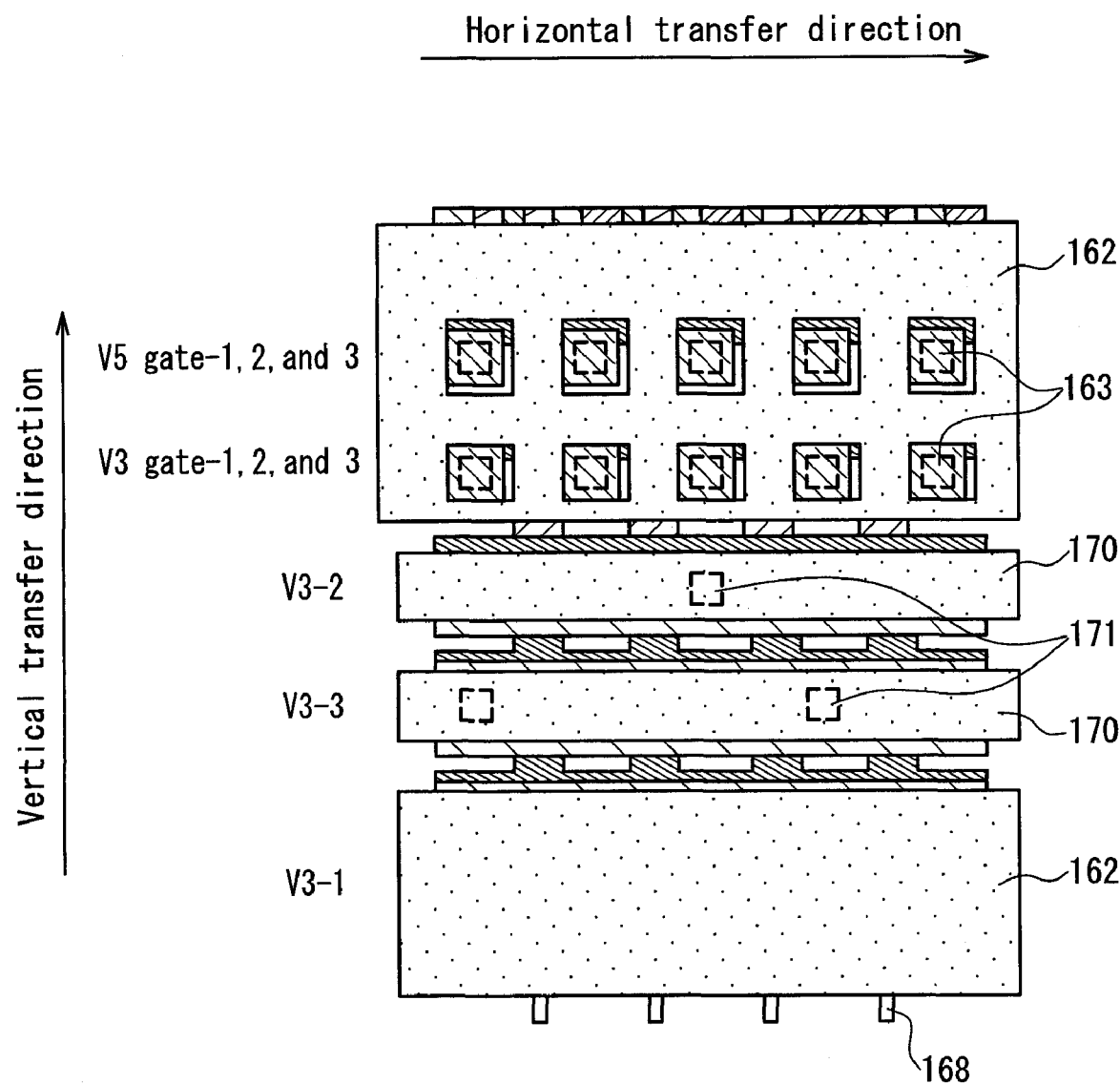
FIG. 4 is a diagram of the layout of the wiring and electrodes in the region directly under the effective pixel region in the vertical final stages.
Figure 5:
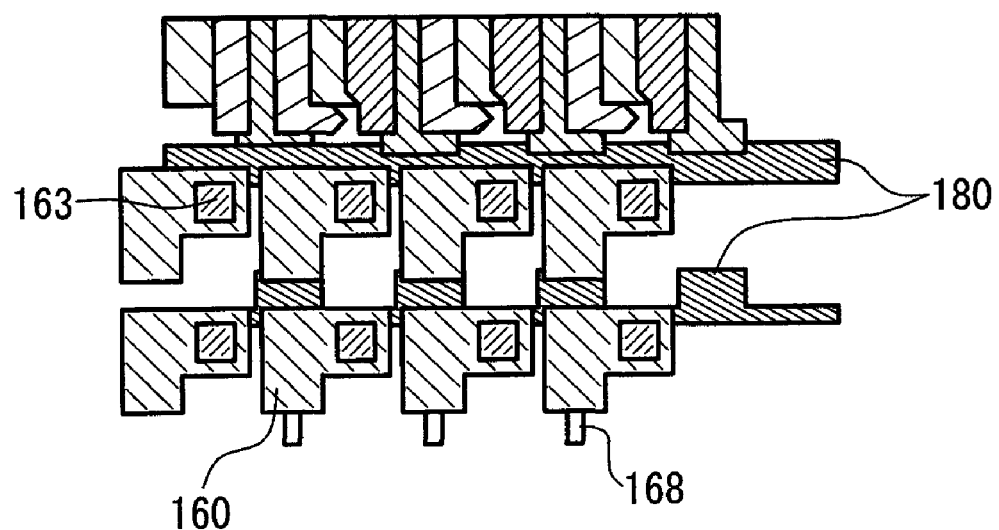
FIG. 5 is a diagram of the layout of the wiring and electrodes in the region directly under the effective pixel region in the vertical final stages.
Figure 6:
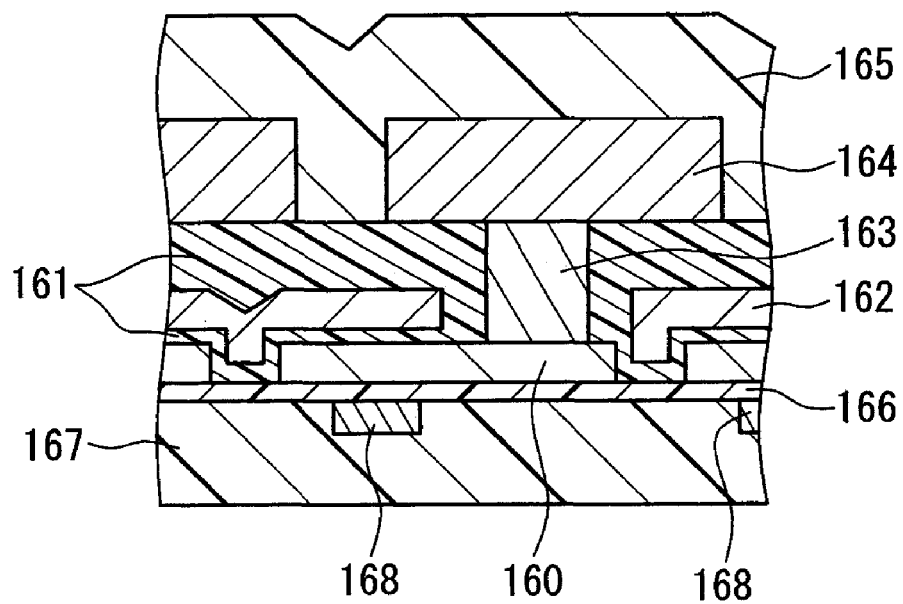
FIG. 6 is a cross-sectional view along the line A-A in FIG. 3.

FIGS. 3 to 5 are diagrams of the layout of the wiring and electrodes in the region directly under the effective pixel region in the vertical final stages. FIG. 3 is a diagram of the layout of aluminum wiring, FIG. 4 is a diagram of a state in which the aluminum wiring has been removed from the configuration shown in FIG. 3, and FIG. 5 is a diagram of a state in which the light blocking film has been removed from the configuration shown in FIG. 4. In FIGS. 3 to 5, the horizontal transfer component 4 is located above in the drawings. FIG. 6 is a cross-sectional view along the line A-A in FIG. 3.

It can be seen in FIGS. 3 to 6 that the fifth phase electrodes (V5-1, V5-2, V5-3) in the region directly under the effective pixel region in the vertical final stages of the solid-state imaging device 1 are formed as independent electrodes by a second layer polysilicon gate 160 (see FIGS. 5 and 6 in particular) in an island-shaped pattern. The third phase electrodes in the region directly under the effective pixel region in the vertical final stages of the solid-state imaging device 1 also are formed as islands, the same as the fifth phase electrodes. The first phase electrodes also are formed by the second layer polysilicon gate 160. The second phase, fourth phase, and sixth phase electrodes are formed by a first layer polysilicon gate 180 (see FIG. 5) patterned into a layer different from that of the second layer polysilicon gate 160. The first layer polysilicon gate 180 that forms the second phase, fourth phase, and sixth phase electrodes is formed continuously and in common with the various columns as shown in FIG. 5.

A tungsten light blocking film 162 is provided via an interlayer insulating film 161 on the upper layer of the second layer polysilicon gate 160. Aluminum wiring 164 is further patterned in the upper layer of the interlayer insulating film 161. The upper layer of the wiring 164 is covered with a protective film 165. Openings 162a (FIG. 7) are provided in the light blocking film 162, and the second layer polysilicon gate 160 and the aluminum wiring 164 are electrically connected by contact plugs 163 that pass through these openings 162a and the interlayer insulating film 161. The second layer polysilicon gate 160 is formed on the surface of a gate insulating film 166 formed over a silicon substrate 167, and vertical transfer paths 168 are formed inside the silicon substrate 167 under the second layer polysilicon gate 160.

As shown in FIG. 3, the aluminum wiring 164 connected by the contact plugs 163 to the fifth phase independent electrodes V5-1, V5-2, and V5-3 in the vertical final stages extends in the vertical transfer direction of the signal charges, and is disposed so as to pass over the horizontal transfer component 4 (see FIG. 1). Meanwhile, the aluminum wiring 164 connected by the contact plugs 163 to the third phase independent electrodes V3-2 and V3-3 in the vertical final stages extends in the opposite direction from the direction in which the signal charges are vertically transferred, and is electrically connected by contact plugs 171 to tungsten wiring 170 that also serves as a light blocking film. The aluminum wiring 164 connected by the contact plugs 163 to the independent electrode V3-1 is connected to aluminum wiring 172 formed in the same layer.

Figure 7:
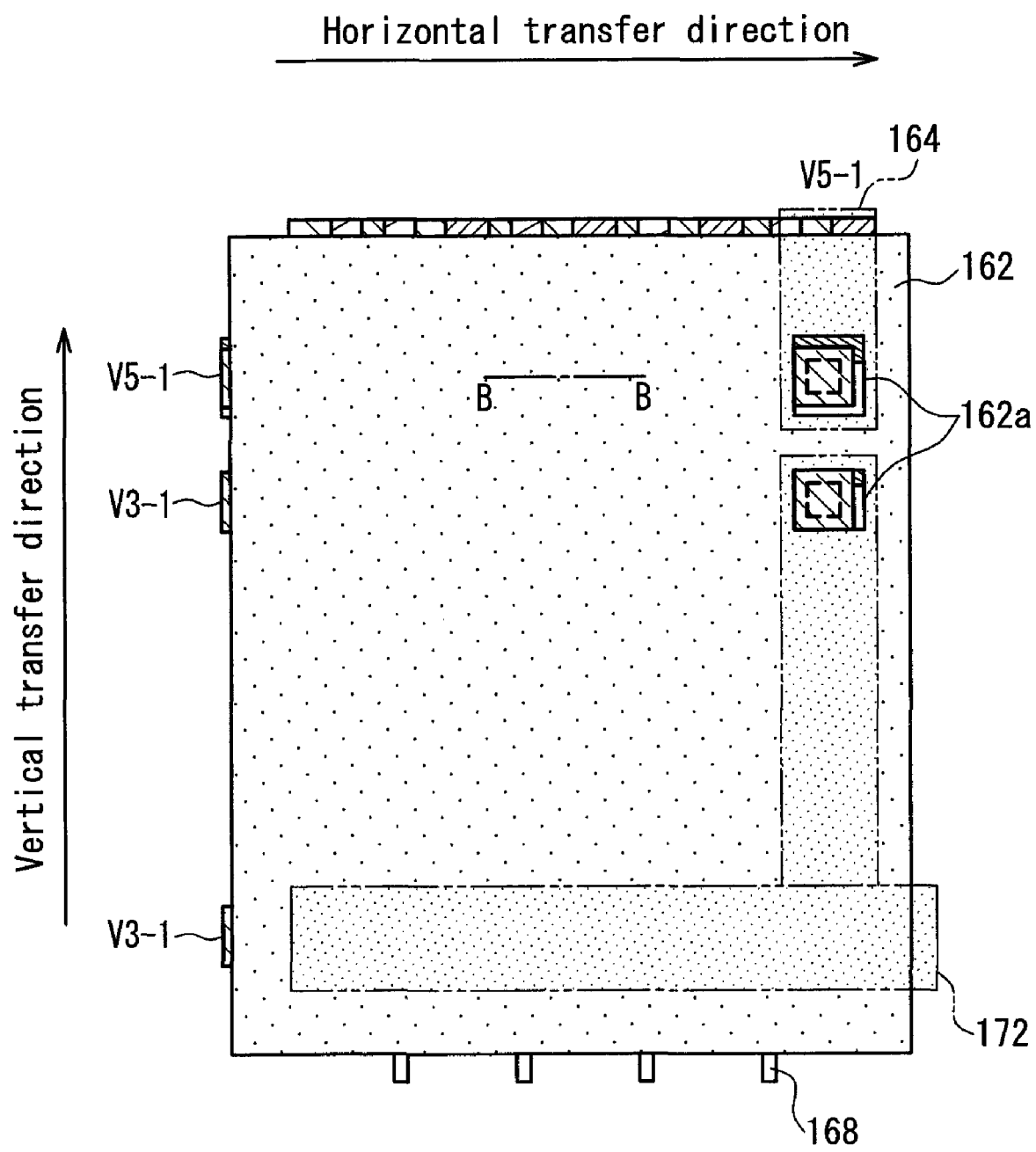
FIG. 7 is a diagram of the layout of the wiring and electrodes in the region directly under the OB region in the vertical final stages.
Figure 8:
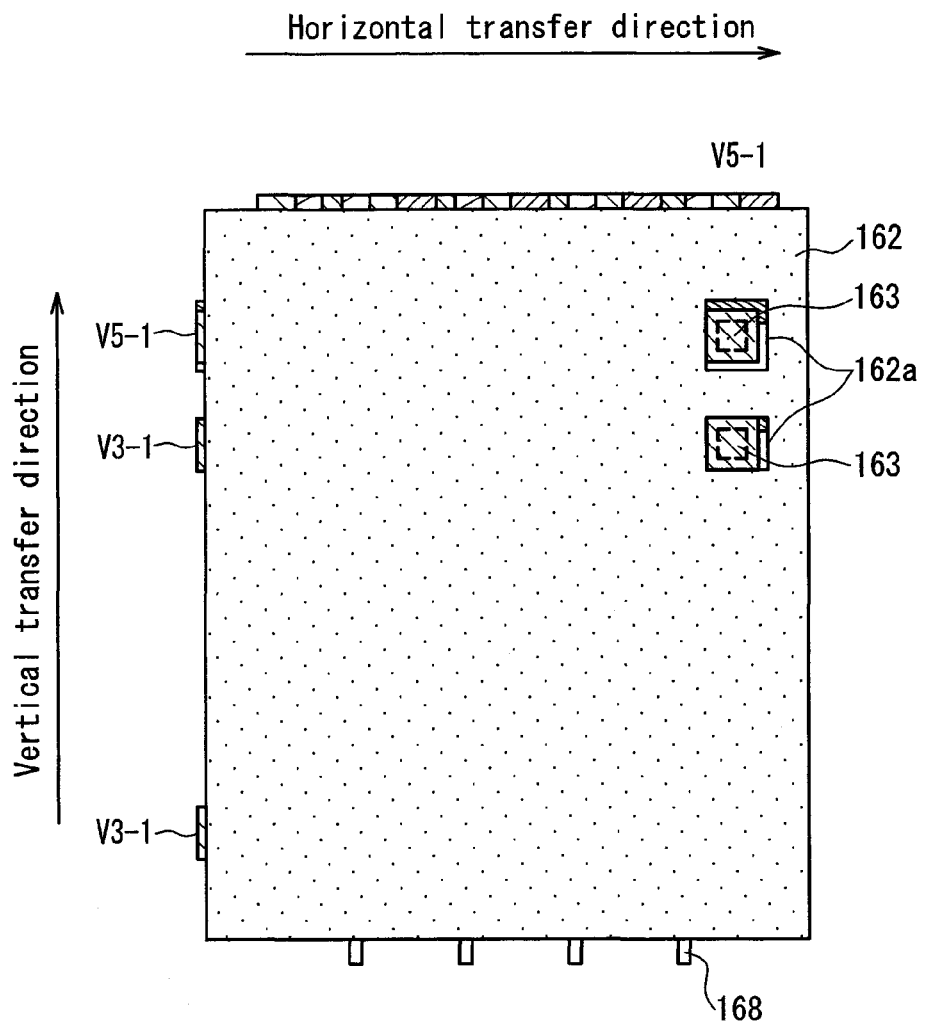
FIG. 8 is a diagram of the layout of the wiring and electrodes in the region directly under the OB region in the vertical final stages.
Figure 9:
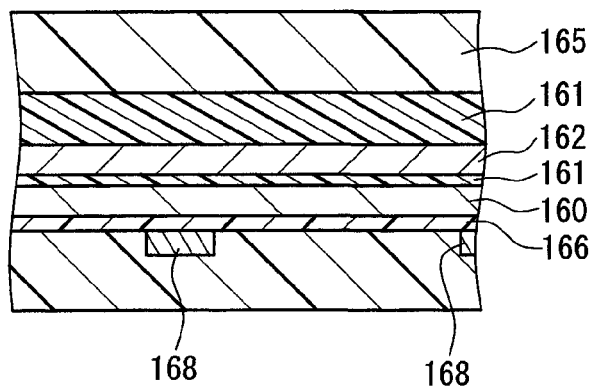
FIG. 9 is a cross-sectional view along the line B-B in FIG. 7.

FIGS. 7 to 9 are diagrams of the layout of the wiring and electrodes in the region directly under the OB region in the vertical final stages. FIG. 7 is a diagram of the aluminum wiring layout, and FIG. 8 is a diagram of a state in which the aluminum wiring has been removed from the construction shown in FIG. 7. In FIGS. 7 and 8, the horizontal transfer component 4 is located above in the drawings. FIG. 9 is a cross-sectional view along the line B-B in FIG. 7.

As shown in FIG. 9, in the region directly under the OB region in the vertical final stages, the second layer polysilicon gate 160 is formed continuously as a common electrode that is common to the various columns. As shown in FIGS. 7 to 9, in the region directly under the OB region in the vertical final stages, the tungsten light blocking film 162 is formed over the entire surface, except for the openings 162a provided at two locations in the column at the very end on the effective pixel region side. These openings 162a are provided to allow the passes of the contact plugs 163, which electrically connect the aluminum wiring 164 with the second layer polysilicon gate 160 serving as the electrodes V3-1 and V5-1 formed in common with the various columns. Thus, with the solid-state imaging device 1, substantially the entire region directly under the OB region in the vertical final stages can be shielded from light by the tungsten light blocking film 162, and this prevents improper clamping.

As shown in FIGS. 1 and 7, the common electrodes (V3-1 and V5-1) of the region directly under the OB region in the vertical final stages are preferably provided with wiring for applying drive pulses to both ends of these common electrodes. This is because there is less rounding of the drive waveform when drive pulses are applied from both ends of the common electrodes. However, the aluminum wiring 164, openings 162a, and contact plugs 163 shown in FIG. 7 are not essential, and can be omitted if there is no problem with rounding of the drive waveform. In this case, the entire surface of the region directly under the OB region in the vertical final stages will be covered by the tungsten light blocking film 162, without any openings provided, so the OB region can be shielded completely from light, and improper clamping can be prevented even more effectively.

An example now will be described of the mixing of pixels in the horizontal direction with the solid-state imaging device 1.

The solid-state imaging device 1 has a control unit (not shown) that controls the transfer operation of the vertical transfer components 3 and the horizontal transfer component 4, so that the signal charges of three pixels in every other column in the horizontal direction are mixed, and the number of pixels in the horizontal direction is reduced to ⅓. Specifically, with the solid-state imaging device 1, because the number of pixels in the vertical direction is reduced to ⅓ as mentioned above, and the number of pixels in the horizontal direction also is reduced to ⅓, the total number of pixels is reduced to ⅑.

Figure 10:
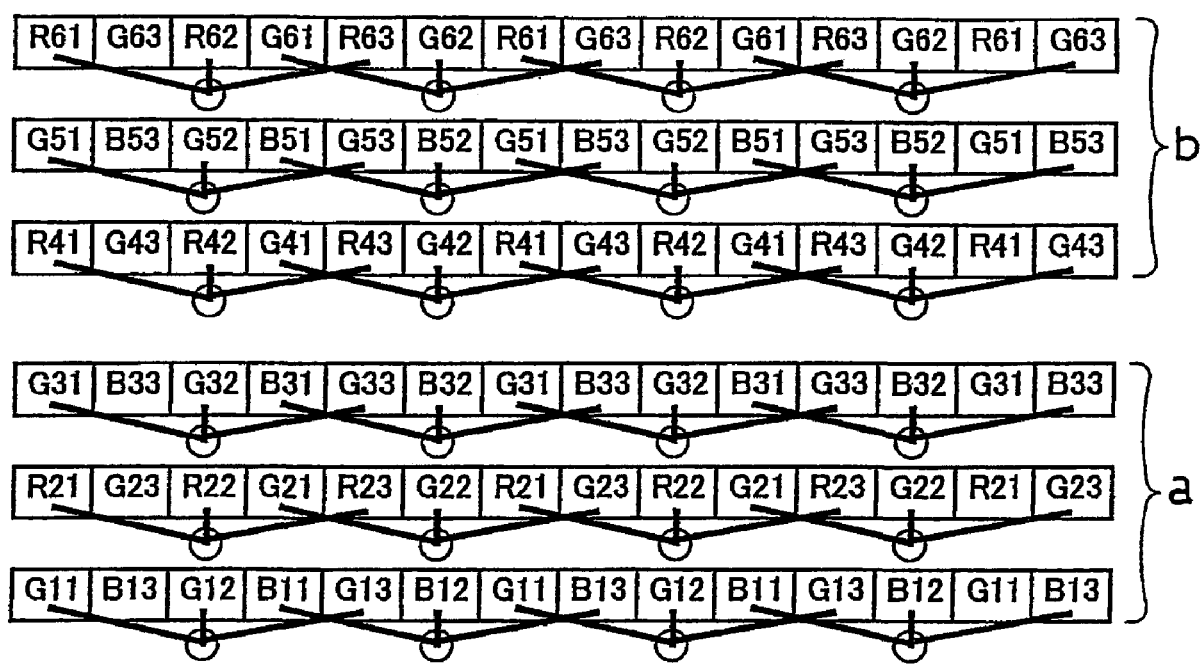
FIG. 10 is an explanatory diagram showing combinations of pixels in which signal charges are mixed in the horizontal direction.

FIG. 10 shows combinations of pixels in which signal charges are mixed in the horizontal direction. A combination of mixed pixels hereinafter will be referred to as a mixed pixel group. In FIG. 10, with a signal indicated by Rxy, for example, R, G, or B indicates the color of a filter provided for a given pixel, x is the vertical position of that pixel (referred to as the first stage, second stage, and so on, starting from the side closest to the horizontal transfer component 4), and y is the position of that pixel in the mixed pixel group (referred as the first, second, and so on, starting from the side closest to the output side of the horizontal transfer component 4).

As shown in FIG. 10, in the solid-state imaging device 1, for instance, three green pixels arranged at every other pixel, such as G11, G12, and G13, constitute a first mixed pixel group. Further, mixed pixel groups consisting of blue pixels are determined so that the centers of gravity of mixed pixels produced from this first pixel mixture group are equidistantly spaced. That is, a second pixel mixture group consists of three pixels, which are B11, which is located between G12 and G13 of the first pixel mixture group, B12, which is a pixel located between G13 and G11 of the adjacent mixed pixel group, and B13, which is a pixel located between G12 and G11 of the adjacent mixed pixel group. Thus, among the pixels of two different colors disposed alternately in the horizontal direction, three pixels each, arranged at every other pixel, are combined and mixed so that the centers of gravity of pixels of each color are spaced equidistantly after mixing. This means that no moire or alias is generated. Further, the three rows indicated by a and the three rows indicated by b in FIG. 10 are each mixed in the vertical direction.

Next, the drive procedure of the solid-state imaging device 1 for performing pixel mixing in the combinations shown in FIG. 10 will be described with reference to FIGS. 11 to 20. In FIGS. 11 to 20, each of the pixels in the effective pixel region is indicated by a signal such as Rxy, for example, where R, G, or B indicates the color of a filter provided for a given pixel, x is the vertical position of that pixel (referred to as the first stage, second stage, and so on, starting from the side closest to the horizontal transfer component 4), and y is the position of that pixel in the mixed pixel group (referred to as the first, second, and so on, starting from the side closest to the output side of the horizontal transfer component 4). The pixels in the OB region are indicated by a signal such as RxO, for example, since no mixing is performed in the horizontal direction. Here, R, G, or B indicates the color of a filter provided for a given pixel, and x is the vertical position of that pixel (referred to as the first stage, second stage, and so on, starting from the side closest to the horizontal transfer component 4). The 0 at the end indicates that this is a pixel in the OB region. The numerals shown at the top of each column in FIGS. 11 to 20 and in FIGS. 22 to 31 (discussed below) indicate whether the columns correspond to a first, second, or third column for the effective pixel region, and for the OB region, these numerals indicate the number of the column in the effective pixel region (first or third column) driven simultaneously with the respective columns.

As discussed above, the columns of the vertical final stages of the vertical transfer components 3 constituted by three-column units are configured such that transfer can be performed independently and separately with any vertical final stage in another column and with any other vertical transfer stage in the same column. For instance, just the signal charge of the vertical final stage of the second column can be transferred to the horizontal transfer component 4 while the signal charges are left alone in the vertical final stages of the first and third columns. Also, just the signal charge of the vertical final stage of the third column can be transferred while the signal charges are left alone in the vertical final stages of the first and second columns.

Figure 11:
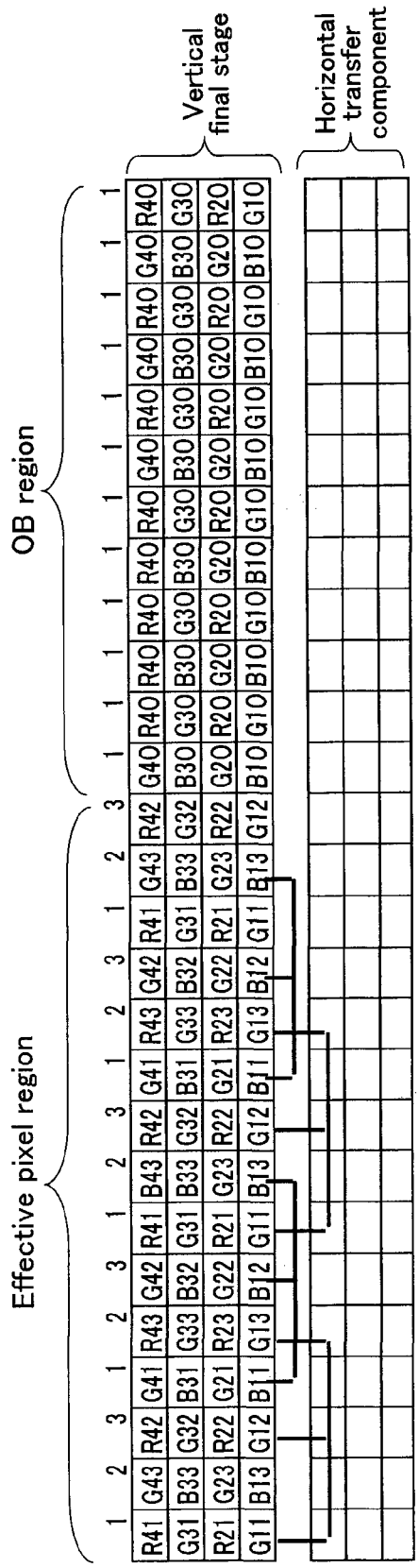
FIGS. 11 to 20 are schematic diagrams illustrating the procedure of pixel mixing in a solid-state imaging device according to an embodiment of the present invention.

FIG. 11 shows a state in which the signal charge has been read out from the photoelectric conversion components 2, and the number of pixels in the vertical direction in the vertical transfer components 3 has been reduced to ⅓, that is, a state in which the signal charge for three mixed pixels is maintained in each of the vertical transfer stages.

Figure 12:
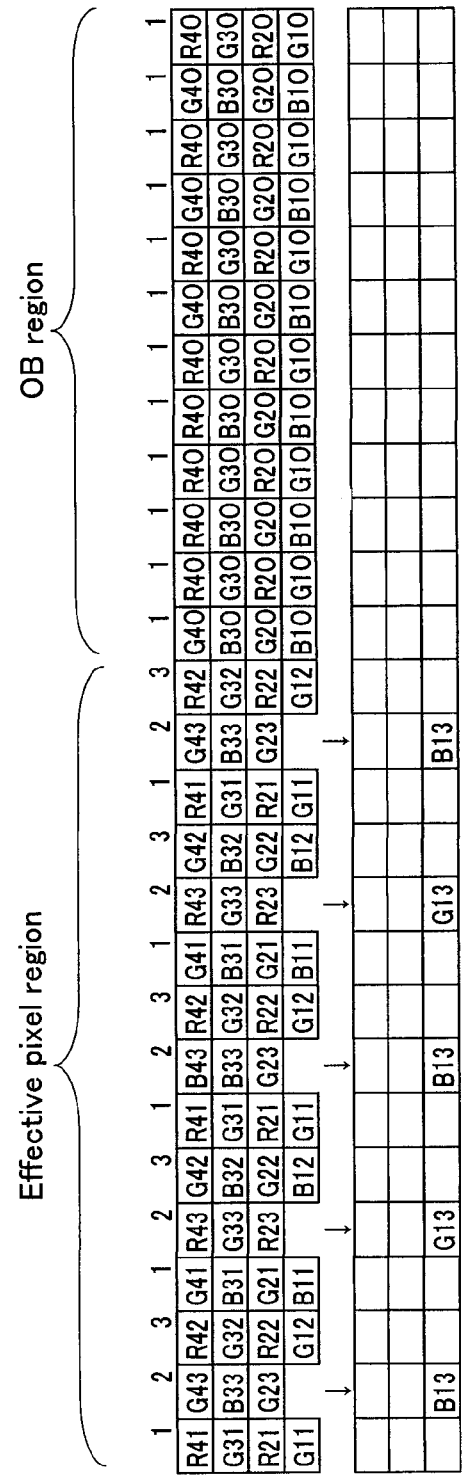

Here, if just the second columns (V3-2, V5-2) in the vertical final stages are driven, then just the signal charge of the vertical final stage of the second column will be transferred to horizontal transfer component 4, as shown in FIG. 12.

Figure 13:
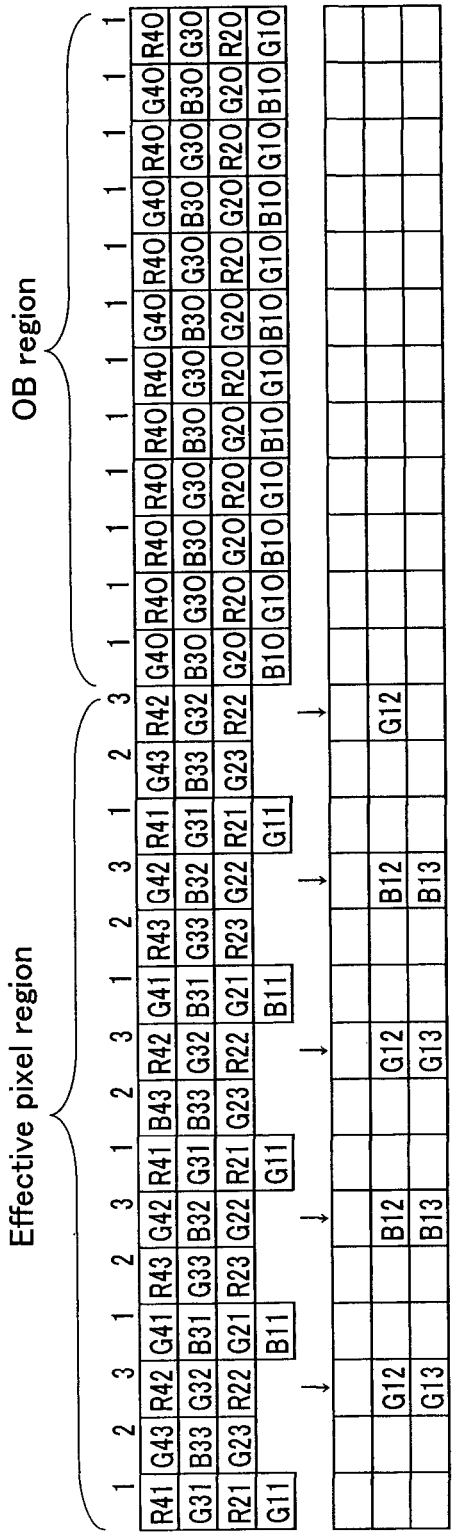

Next, the signal charge for two pixels in the forward direction of the horizontal transfer component 4 is transferred, after which just the third columns (V3-3, V5-3) in the vertical final stage are driven, the result being that just the signal charges of the vertical final stage of the third columns are transferred to the horizontal transfer component 4, as shown in FIG. 13. Consequently, signal charges for pairs of pixels (G12 and G13, and B12 and B13) are mixed within each pair in the horizontal transfer component 4 as shown in FIG. 13.

Then, after the signal charges of the horizontal transfer component 4 have been transferred for another two pixels in the forward direction, the first columns (V3-1, V5-1) in the vertical final stages are driven, the result being that the signal charges of G11 and B11 remaining in the vertical final stages are transferred to the horizontal transfer component 4. Here, the common electrodes V3-1 and V5-1 of the vertical final stages in the region directly under the OB region also are driven at the same time, so the signal charges (B1O, G1O) of the region directly under the OB region in the vertical final stages are all transferred to the horizontal transfer component 4.

Figure 14:
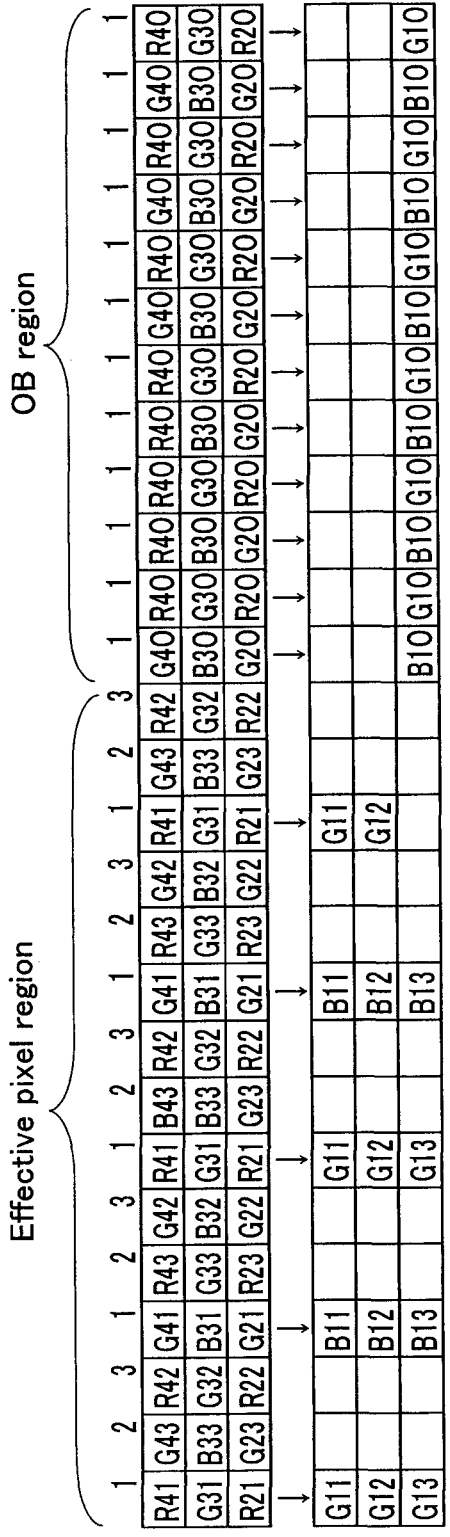
Figures 15, 16:
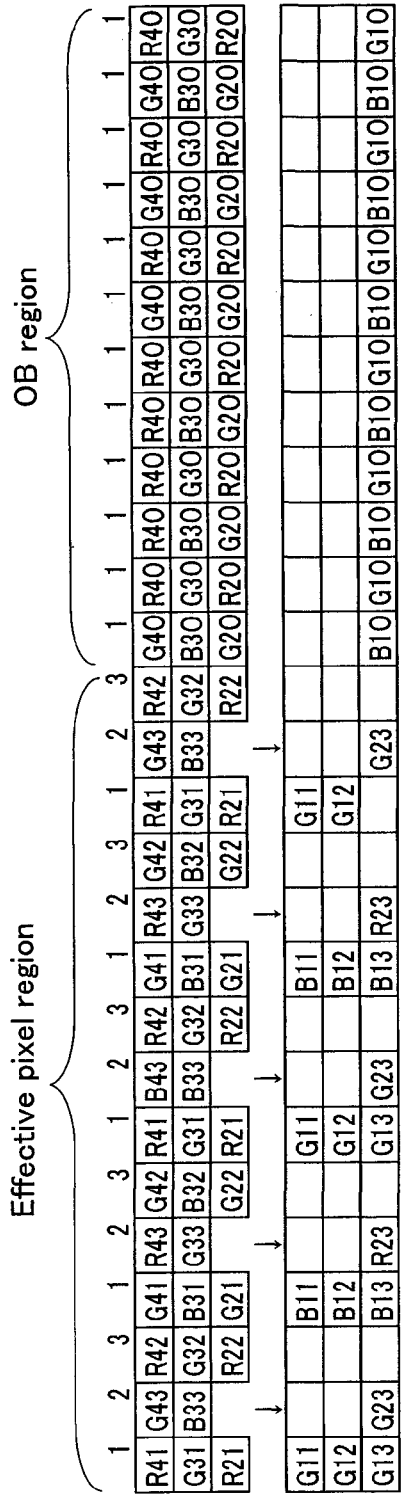
Figure 17:
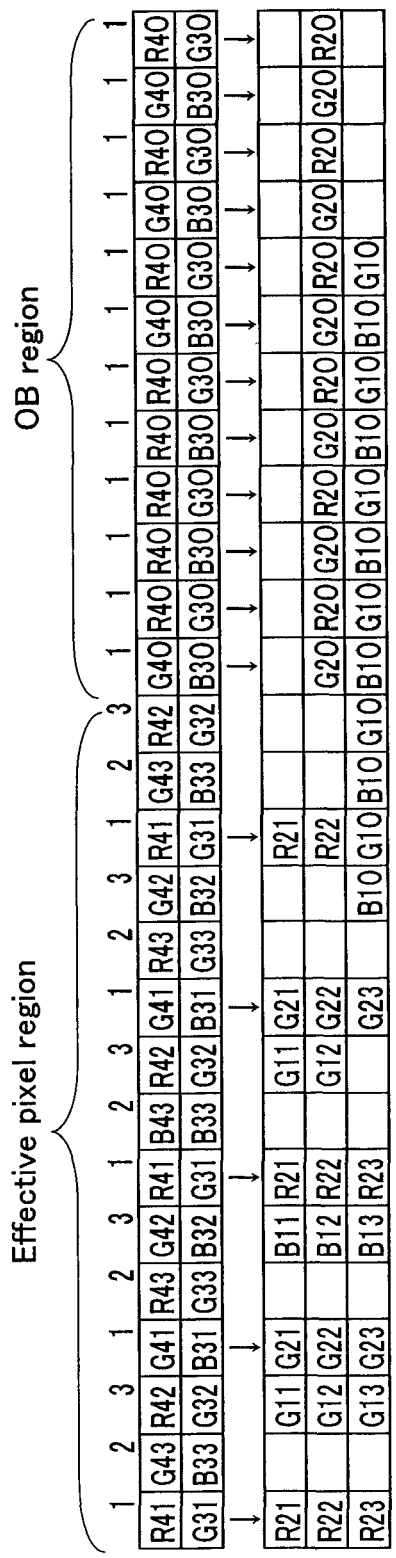
Figure 18:
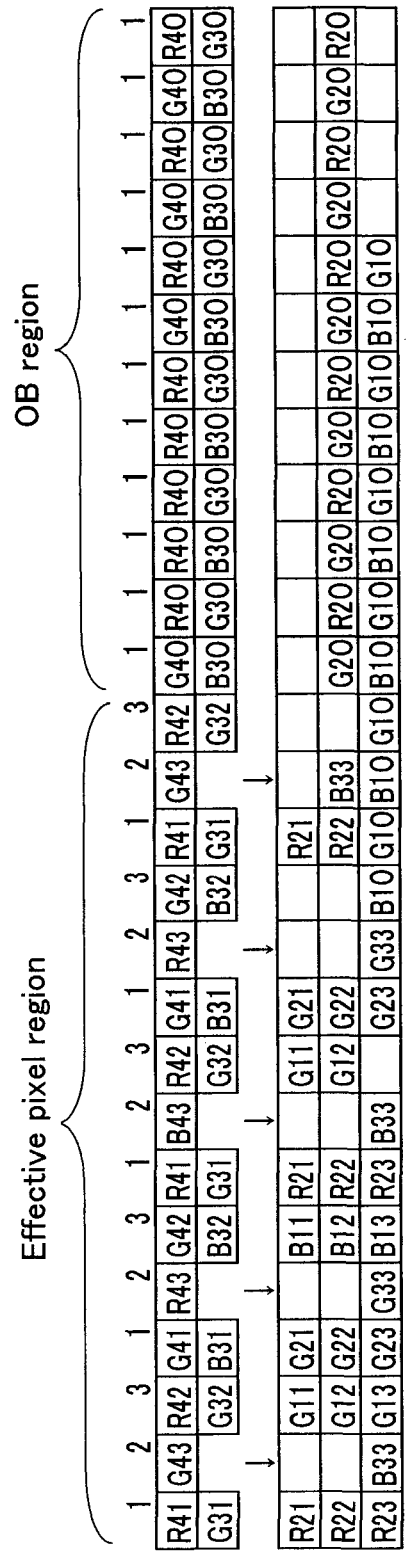
Figure 19:
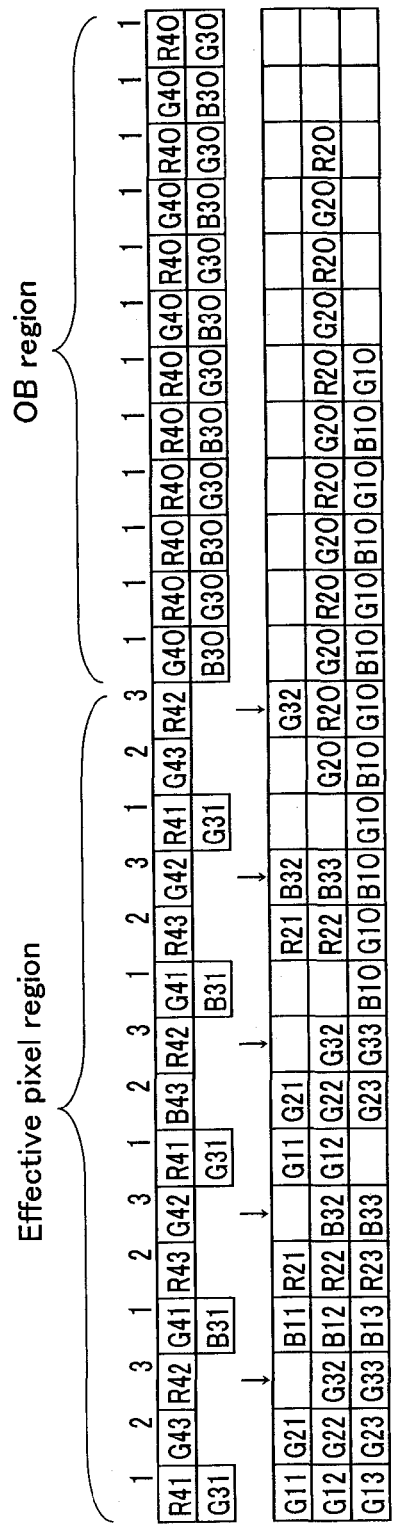

As a result, as shown in FIG. 14, the signal charges of the three pixels G11, G12, and G13 and the signal charges of B11, B12, and B13 transferred from the effective pixel region are mixed in the horizontal transfer component 4. Thus, pixels of two different colors in the same stage are mixed in three-pixel combinations at every other pixel, thereby the number of pixels in the horizontal direction is reduced to ⅓. Also, as can be seen from FIG. 14, green mixed pixels and blue mixed pixels are outputted in an equidistant spacing, so there is no moire or alias.

After this, the driving of the second column, the driving of the third column, and the driving of the first column are repeated for another two cycles in the same manner as above, which completes the transfer of signal charges for three rows (the row indicated by a in FIG. 10) to the horizontal transfer component 4 as shown in FIGS. 15 to 20.

Figure 20:
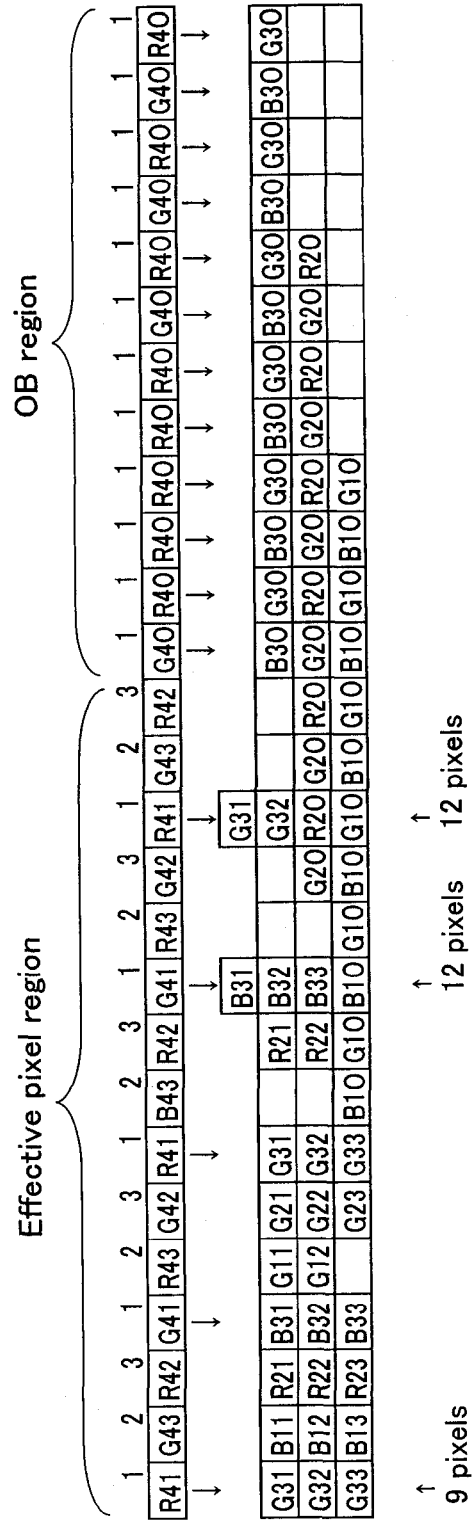

As shown in FIG. 20, the signal charges transferred to the horizontal transfer component 4 are outputted in order from the horizontal transfer component 4. The video signal outputted from the horizontal transfer component 4 consists of pixels arranged one-dimensionally, so to return this signal to its original two-dimensional arrangement, the output signal from the horizontal transfer component 4 is processed by an image processor located outside the solid-state imaging device 1 to rearrange the signal two-dimensionally.

Furthermore, as shown in FIG. 20, the signal charges transferred to the horizontal transfer component 4 include a variance in the number of mixed pixels at the boundary between the effective pixel region and the OB region because the horizontal mixing formats thereof are different. Since one stage of signal comprises three pixels mixed in the vertical direction, a maximum of 12 pixels are mixed.

Figure 21:
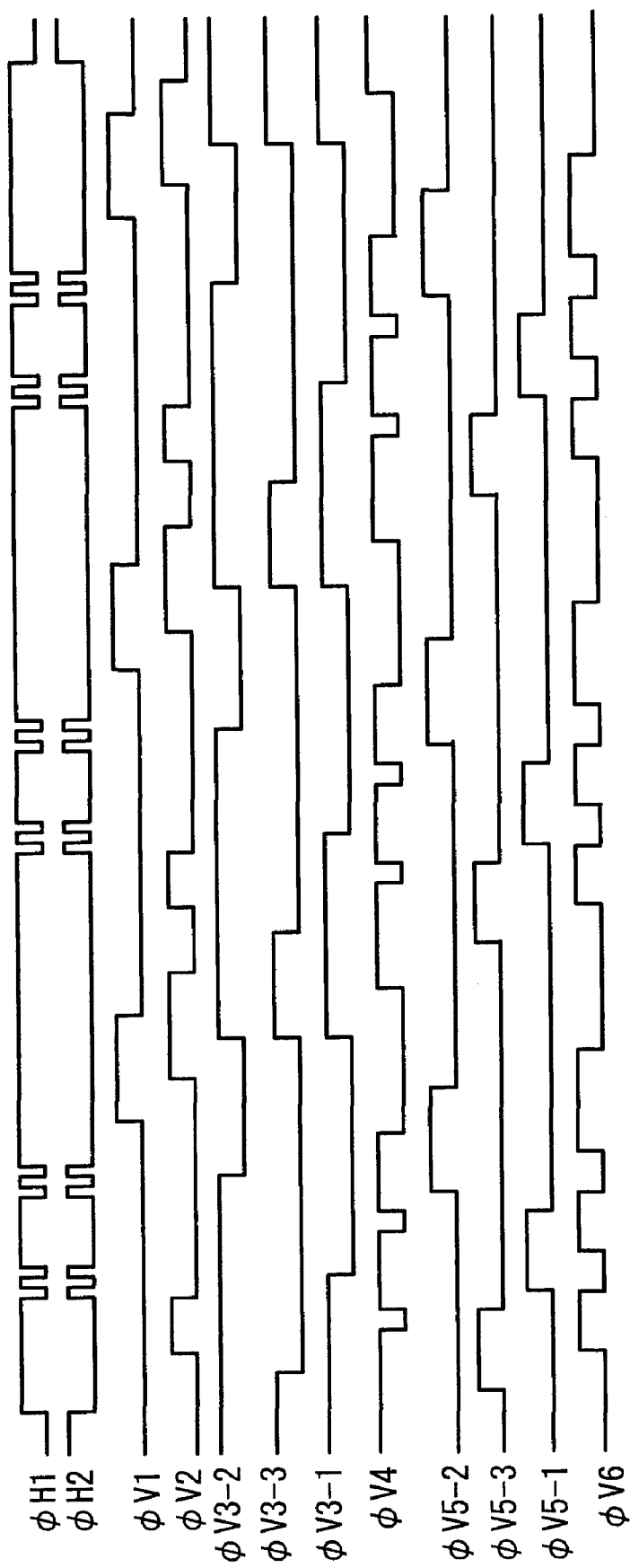
FIG. 21 is a timing chart indicating the drive signals for accomplishing the pixel mixing shown in FIGS. 11 to 20.
Figure 22:
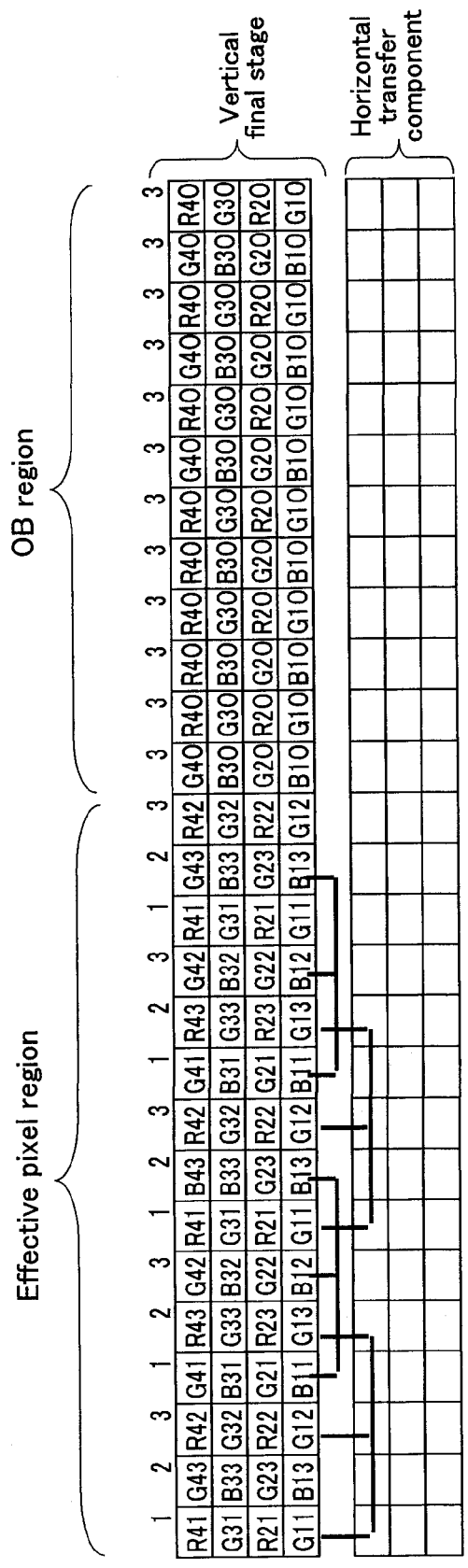
FIGS. 22 to 31 are schematic diagrams illustrating the procedure of pixel mixing in a solid-state imaging device according to an embodiment of the present invention.
Figure 23:
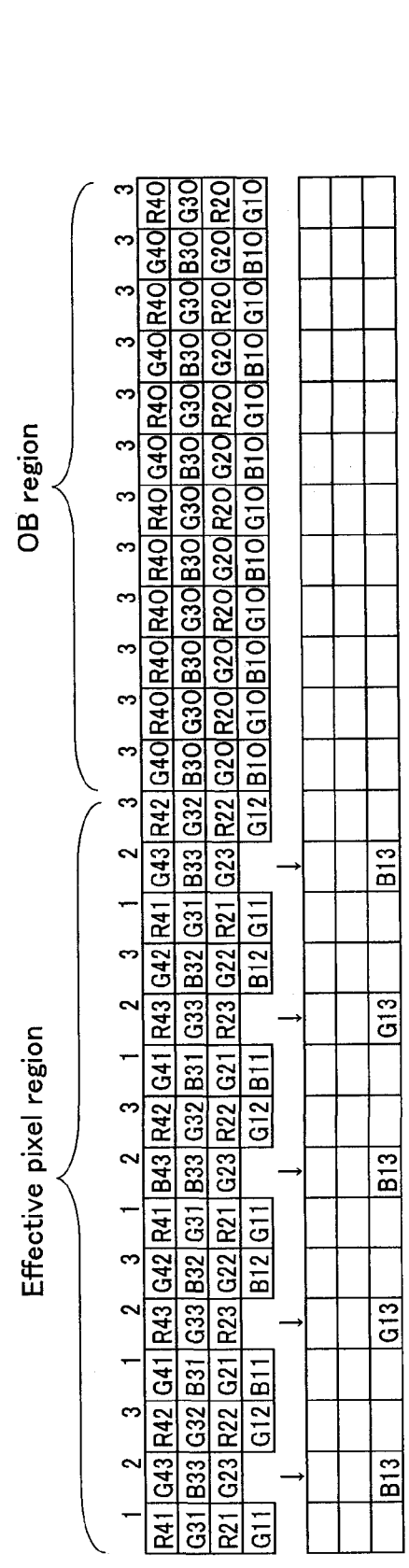
Figure 24:
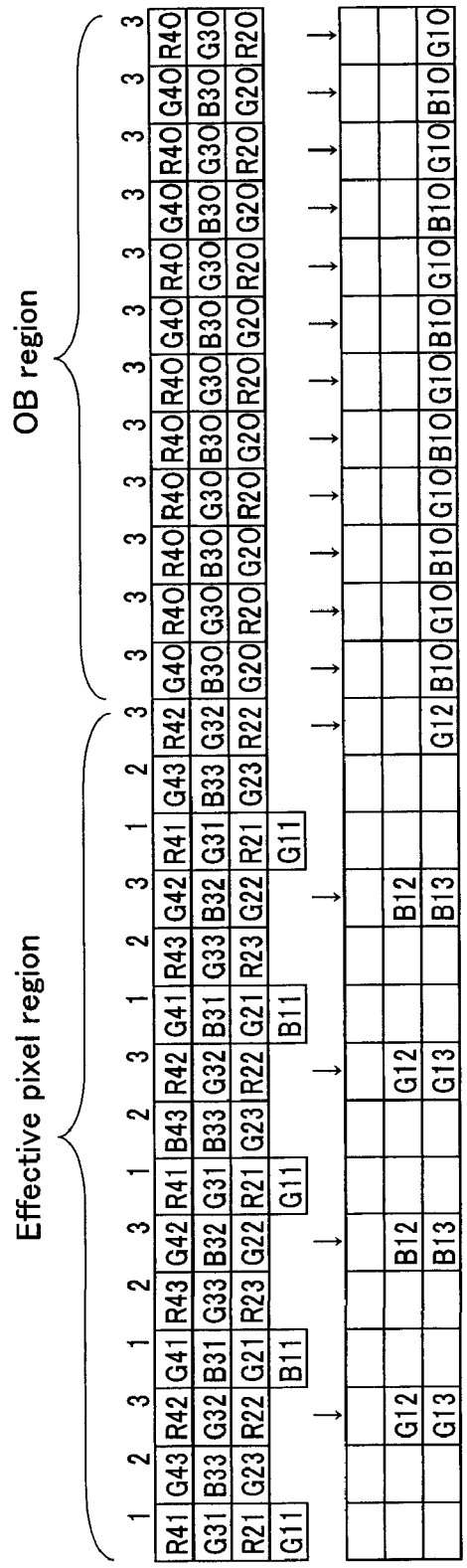
Figure 25:
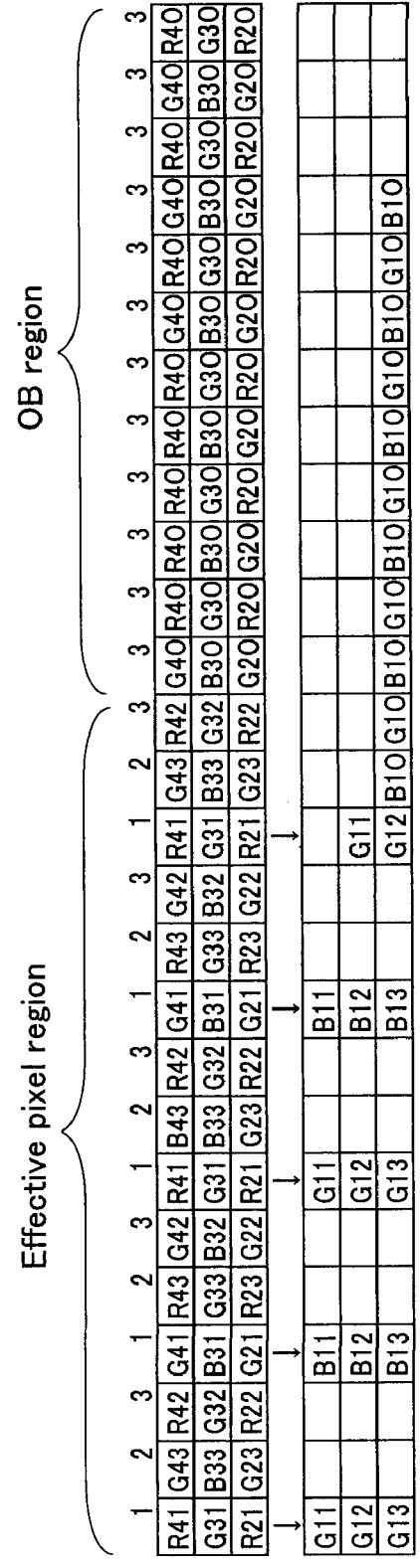
Figure 26:
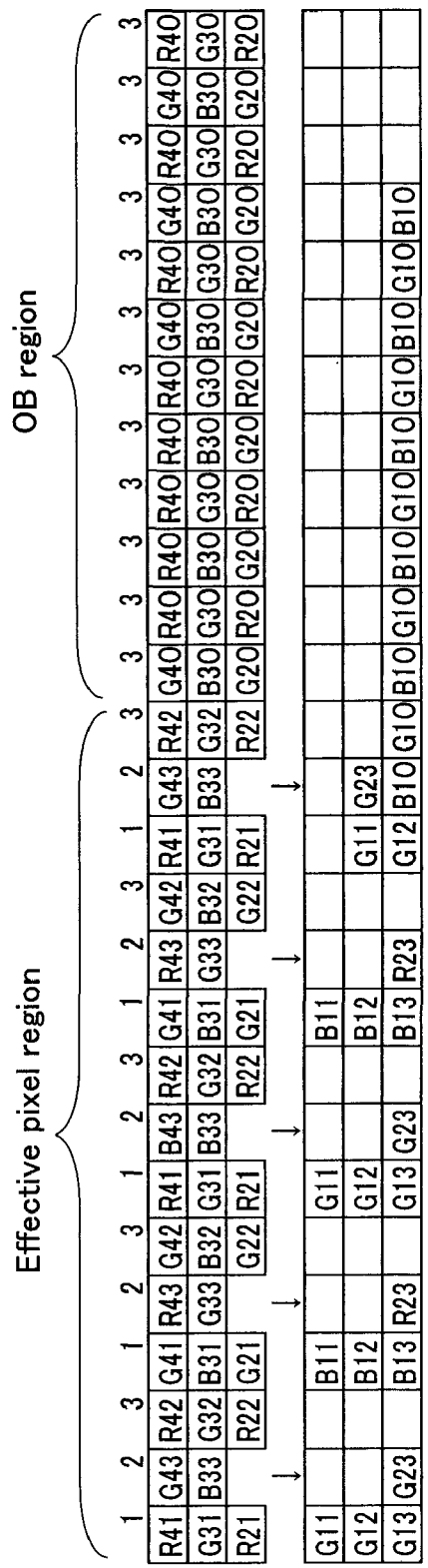
Figure 27:
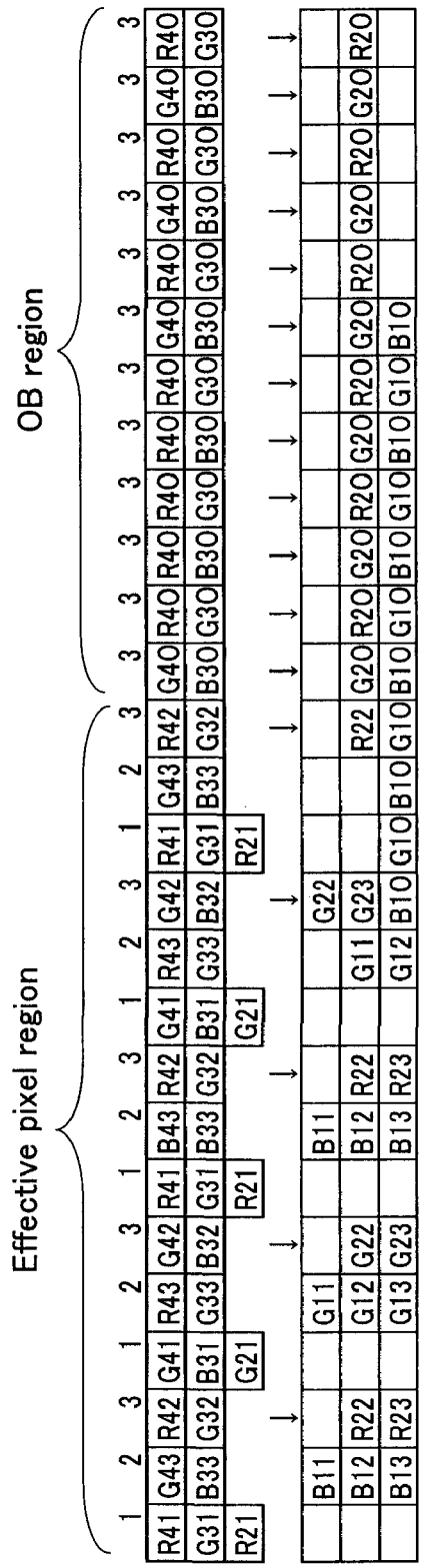
Figure 28:
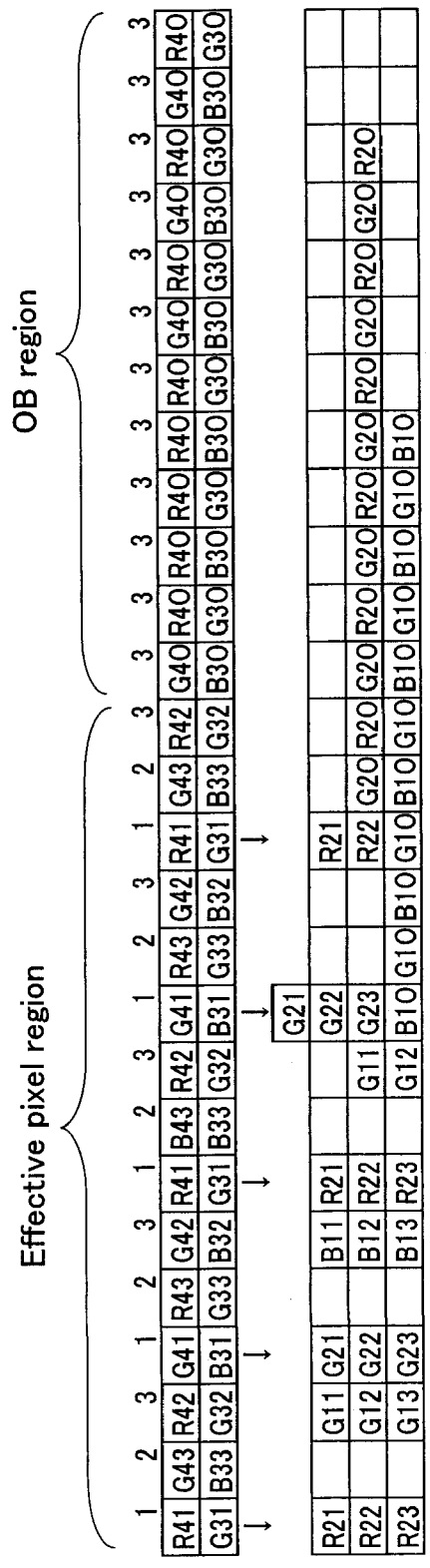
Figure 29:
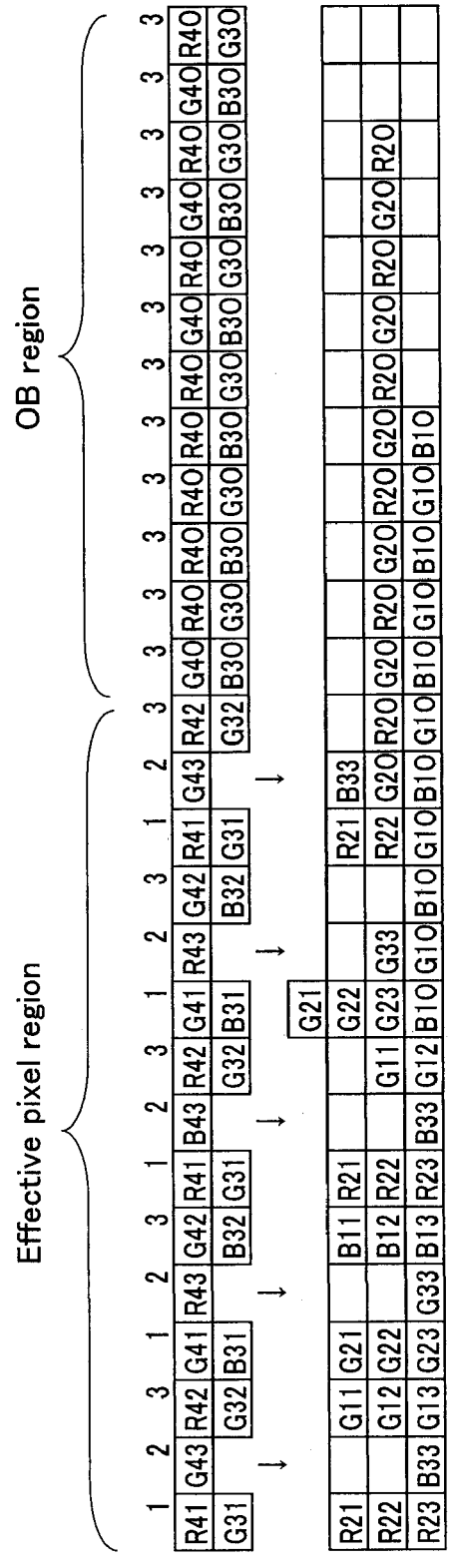
Figure 30:
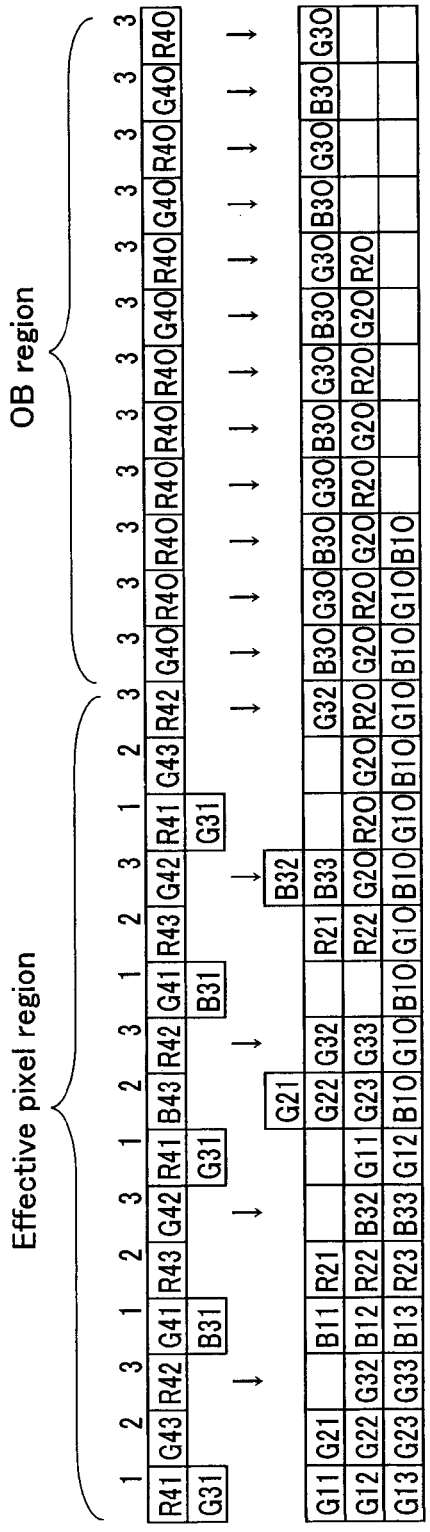

FIG. 21 is a drive timing chart used for the pixel mixing procedure shown in FIGS. 11 to 20. In FIG. 21, if the drive pulses applied to the electrodes are at a high level, these electrodes serve as storage components, while they serve as barrier components when drive pulses are at a low level.

An example of the method for driving the solid-state imaging device 1 is described above through reference to FIGS. 11 to 20, but the method for driving the solid-state imaging device 1 is not limited to just this example. For instance, as shown in FIG. 1, the example shown in FIGS. 11 to 20 is premised on a construction in which the common electrodes in the region directly under the OB region in the vertical final stages were connected to the same wiring as the independent electrodes V3-1 and V5-1 in the vertical final stages directly under the effective pixel region. However, the construction of the solid-state imaging device 1 is not limited to this, and for example, the common electrodes in the region directly under the OB region in the vertical final stages may be connected to the same wiring as the independent electrodes V3-3 and V5-3 in the vertical final stages directly under the effective pixel region. In this case, the procedure for mixing pixels in the horizontal direction of the solid-state imaging device 1 is as shown in FIGS. 22 to 31.

Figure 31:
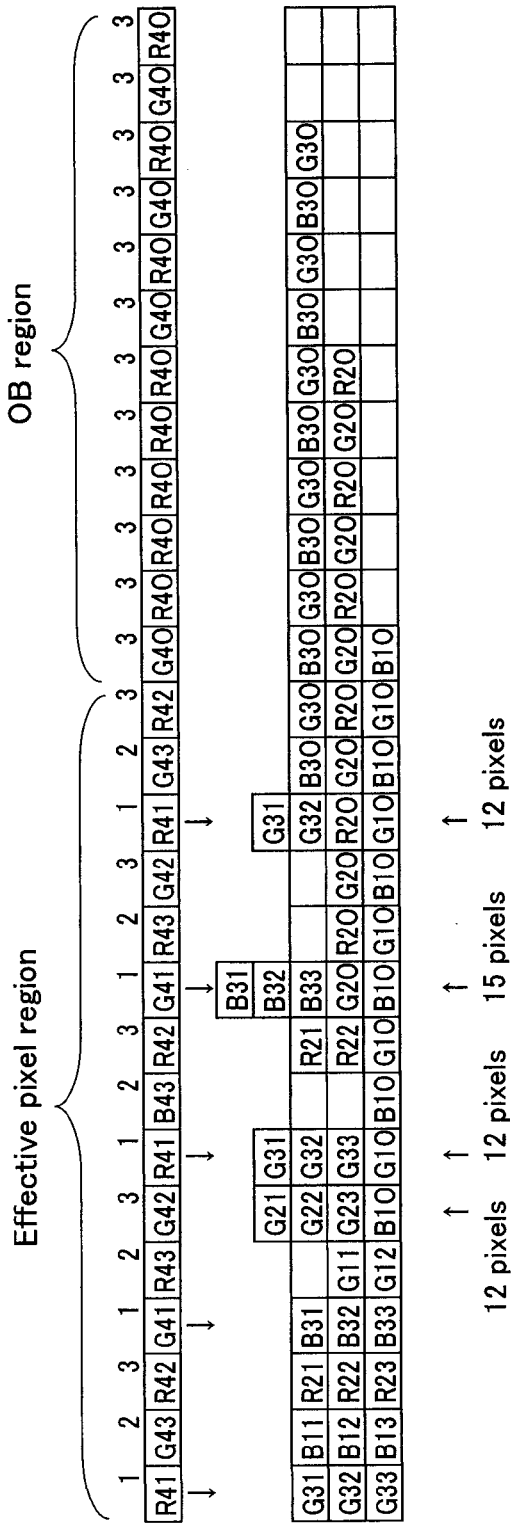

As shown in FIG. 31, the signal charge transferred to the horizontal transfer component 4 has a variance in the number of mixed pixels at the boundary between the OB region and the effective pixel region, just as with the signal charge shown in FIG. 20, and a maximum of 15 pixels are mixed.

In the above embodiment, the common electrodes in the region directly under the OB region in the vertical final stages were connected to the same wiring as the independent electrodes V3-1 and V5-1, or V3-3 and V5-3, in the vertical final stages directly under the effective pixel region. However, besides this, the configuration may be such that the common electrodes in the region directly under the OB region in the vertical final stages are connected to the same wiring as the common electrodes (V3 and V5) of the effective pixel region. With this configuration, the number of electrode terminals and types of drive pulses can be reduced, which is advantageous in that the configuration of the solid-state imaging device 1 can be simplified. Also, the independent electrodes V3-1 and V5-1 at the same time may be the same wiring as that of the common electrodes (V3 and V5) of the effective pixel region, in which case not only is the configuration of the solid-state imaging device 1 simplified as above, but the maximum number of mixed pixels can be 12, the advantage to which is that the increase in dark signals caused by a variance in the number of mixed pixels can be kept to a minimum.

A solid-state imaging device is described above as an embodiment of the present invention, but the solid-state imaging device 1 described above is nothing more than one specific example. For instance, the present invention is not limited to a solid-state imaging device with the filter layout shown in FIG. 2, and other layouts also are possible. Furthermore, the present invention also can be applied to a solid-state imaging device used for monochrome images in which no color filter is used.

Also, an example in which m=3 is described above, but m is not limited to 3, and the present invention also can be applied to a construction in which pixel mixing is performed in the horizontal direction by independently driving the transfer electrodes in each column in the final transfer stages.

Furthermore, if the solid-state imaging device described in the above embodiment is applied to a digital camera, since data will be outputted at high speed from the solid-state imaging device, high-speed operation is possible, and a digital camera of excellent image quality can be obtained. Since it is possible to switch between the high-speed operation of the present invention and ordinary full-pixel read-out operation, it is possible to obtain a digital camera that has both a moving picture (high-speed operation) mode and a still picture (full-pixel read-out operation) mode.

Figure 32:
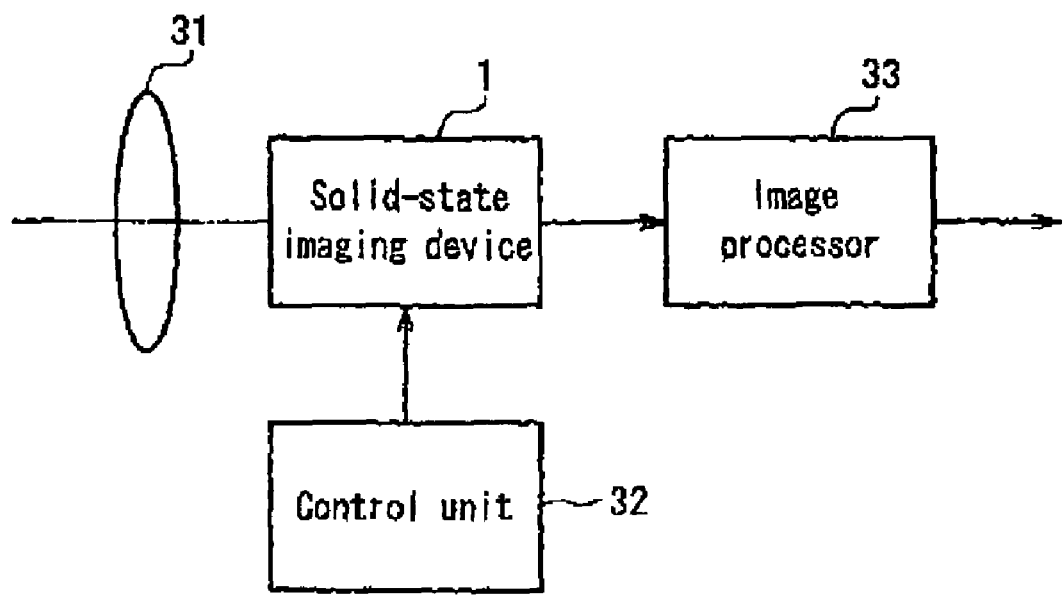
FIG. 32 is a block diagram of the simplified structure of a camera according to an embodiment of the present invention.
Figure 33:
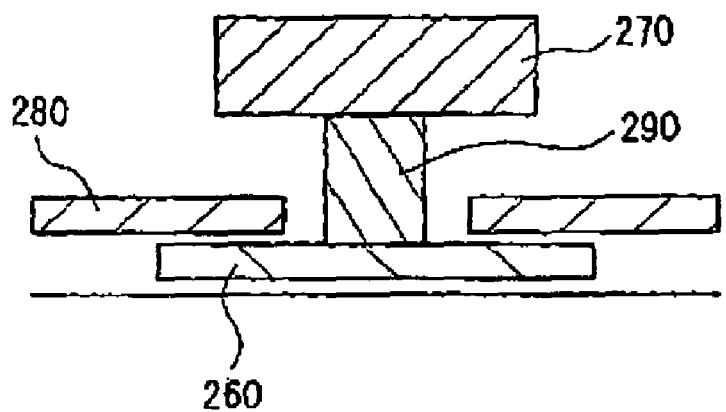
FIG. 33 is a cross-sectional view of the structure of a conventional solid-state imaging device.

FIG. 32 shows an example of the configuration of the digital camera according to the present invention. This digital camera comprises an optical system 31 including a lens for focusing light incident from a subject onto an imaging plane of the solid-state imaging device 1; a control unit 32 that controls drive of the solid-state imaging device 1; and an image processor 33 that subjects signals outputted from the solid-state imaging device 1 to various signal processing. This construction prevents improper OB clamping in the solid-state imaging device 1, which allows a digital camera to be obtained with which good-quality video signals can be outputted at high speed.

The present invention can be utilized as a solid-state imaging device that prevents improper OB clamping in a solid-state imaging device that performs pixel mixing in the horizontal direction, thereby allowing good-quality images to be outputted at high speed, and as a camera provided with this device.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   photoelectric conversion components disposed two-dimensionally corresponding to pixels, forming an effective pixel region and an OB region provided on one or both sides in the horizontal direction of the effective pixel region;
   vertical transfer components provided corresponding to respective columns of two-dimensionally arranged pixels to vertically transfer signal charges read out from the pixels; and
   a horizontal transfer component for horizontally transferring the signal charges received from the vertical transfer components,
   wherein vertical final stages, which are the transfer stages closest to the horizontal transfer component in the vertical transfer components, have identical transfer electrode configurations repeated every m (m is an integer of 2 or greater) columns in a region between the horizontal transfer component and an effective pixel region,
   the vertical final stages are made up of six phases of the transfer electrodes,
   third and fifth phases of the vertical final stages in a region between the horizontal transfer component and the effective pixel region are constituted by independent transfer electrodes that are independent of other columns and independent of the third and fifth phase transfer electrodes of the other vertical transfer stages, so that an operation of transferring from the vertical final stages to the horizontal transfer component is controlled independently of the other columns,
   first, second, fourth and sixth phases of the vertical final stages in the region between the horizontal transfer component and a region including the OB region are constituted by common transfer electrodes that are common to all of the columns in first, second, fourth and sixth phases.

2. The solid-state imaging device according to claim 1, wherein drive signals applied to the common transfer electrode are common to drive signals applied to any of the transfer electrodes in the effective pixel region.

3. A solid-state imaging device, comprising:
   vertical transfer components provided corresponding to respective columns of two-dimensionally arranged pixels to vertically transfer signal charges read out from the pixels; and a horizontal transfer component for horizontally transferring the signal charges received from the vertical transfer components, wherein vertical final stages, which are the transfer stages closest to the horizontal transfer component in the vertical transfer components, have identical transfer electrode configurations repeated every m (m is an integer of 2 or greater) columns in a region between the horizontal transfer component and an effective pixel region, and vertical final stages of columns other than one of the m columns, or the vertical final stages of all the columns, are each provided with an independent transfer electrode that is independent of other columns so that an operation of transferring from the vertical final stages to the horizontal transfer component is controlled independently of the others of the m columns, the vertical final stages have a common transfer electrode that is common to all of the columns in the region between the horizontal transfer component and a region including an OB region provided on one or both sides in the horizontal direction of the effective pixel region, wiring for applying drive signals is connected to both ends of the common transfer electrode, in the vertical final stages, the region between the OB region and the horizontal transfer component is covered with a light blocking film, except for openings formed in the columns closest to the effective pixel region, and the wiring is connected to one of the ends of the common transfer electrode via these openings.

4. The solid-state imaging device according to claim 3, wherein the wiring connected to one of the ends of the common transfer electrode straddles the upper layer of the horizontal transfer component.

5. The solid-state imaging device according to claim 3, wherein drive signals applied to the common transfer electrode are common to drive signals applied to any of the transfer electrodes in the effective pixel region.

6. A camera comprising the solid-state imaging device according to claim 1.

7. A camera comprising the solid-state imaging device according to claim 3.

* * * * *